US007847342B2

(12) United States Patent
Fukuzumi et al.

(10) Patent No.: US 7,847,342 B2
(45) Date of Patent: Dec. 7, 2010

(54) NON-VOLATILE SEMICONDUCTOR STORAGE DEVICE AND METHOD OF MANUFACTURING THE SAME

(75) Inventors: Yoshiaki Fukuzumi, Yokohama (JP); Ryota Katsumata, Yokohama (JP); Masaru Kidoh, Komae (JP); Masaru Kito, Yokohama (JP); Hiroyasu Tanaka, Tokyo (JP); Hideaki Aochi, Kawasaki (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/325,023

(22) Filed: Nov. 28, 2008

(65) Prior Publication Data

US 2009/0146206 A1 Jun. 11, 2009

(30) Foreign Application Priority Data

Nov. 30, 2007 (JP) ............................. 2007-311291

(51) Int. Cl.
*H01L 27/115* (2006.01)
*H01L 21/336* (2006.01)
*H01L 29/792* (2006.01)
*H01L 21/8247* (2006.01)

(52) U.S. Cl. ................ 257/324; 257/326; 257/E21.442; 257/E29.309; 257/E21.692; 257/E27.103; 438/287; 365/148; 365/185.01

(58) Field of Classification Search ................. 257/324, 257/326, 314, E21.412, E29.309, E21.692, 257/E27.423, E27.103, E21.495, E21.442, 257/E29.3, E21.679, E27.69, E21.682; 438/287, 438/585, 591; 365/148, 185.01, 185.23, 365/185.17, 185.18, 225.7, 185.03

See application file for complete search history.

(56) References Cited

U.S. PATENT DOCUMENTS 5,559,724 A 9/1996 Morrison
5,707,885 A 1/1998 Lim (Continued)

FOREIGN PATENT DOCUMENTS

JP 2003-78044 3/2003

(Continued)

OTHER PUBLICATIONS

U.S. Appl. No. 12/501,142, filed Jul. 10, 2009, Fukuzumi et al.
U.S. Appl. No. 12/132,181, filed Jun. 3, 2008, Tanaka et al.
U.S. Appl. No. 12/325,023, filed Nov. 28, 2008, Fukuzumi et al.
U.S. Appl. No. 12/559,865, filed Sep. 15, 2009, Fuzumi et al.

*Primary Examiner*—Sue Purvis
*Assistant Examiner*—Whitney Moore
(74) *Attorney, Agent, or Firm*—Oblon, Spivak, McClelland, Maier & Neustadt, L.L.P.

(57) ABSTRACT

A non-volatile semiconductor storage device has a plurality of memory strings with a plurality of electrically rewritable memory cells connected in series. Each of the memory strings includes: a first columnar semiconductor layer extending in a direction perpendicular to a substrate and having a first hollow extending downward from its upper end; a first insulation layer formed in contact with the outer wall of the first columnar semiconductor layer; a second insulation layer formed on the inner wall of the first columnar semiconductor layer so as to leave the first hollow; and a plurality of first conductive layers formed to sandwich the first insulation layer with the first columnar semiconductor layer and functioning as control electrodes of the memory cells.

11 Claims, 30 Drawing Sheets

U.S. PATENT DOCUMENTS

| | | | |
|---|---|---|---|
| 2004/0232472 A1* | 11/2004 | Sakui et al. | 257/314 |
| 2007/0252201 A1 | 11/2007 | Kito et al. | |
| 2008/0067583 A1 | 3/2008 | Kidoh et al. | |

FOREIGN PATENT DOCUMENTS

| | | |
|---|---|---|
| JP | 2005-64031 | 3/2005 |
| WO | WO 2009/075370 A1 | 6/2009 |

* cited by examiner a Comparative Example — 「Without Deviation of Alignment」 b Comparative Example — 「With Deviation of Alignment」 c Fourth Embodiment — 「Without Deviation of Alignment」 d Fourth Embodiment — 「With Deviation of Alignment」

NON-VOLATILE SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2007-311291, filed on Nov. 30, 2007, the entire contents of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Conventionally, LSIs are formed by integration of devices in a two-dimensional plane on the silicon substrate. Although the dimension for each device must be reduced (refinement) to increase memory storage capacity, recent years are facing challenges in such refinement from the viewpoint of cost and technology. Such refinement requires further improvements in photolithography technology. However, in currently available ArF immersion lithography technology, for example, the resolution limit has been reached around the 40 nm design rule and so EUV exposure devices have to be introduced for further refinement. However, the EUV exposure devices are expensive and infeasible in view of the costs. In addition, if such refinement is accomplished, it is assumed that physical improvement limit, such as in breakdown voltage between devices, would be reached unless driving voltage can be scaled, for example. Thus, it is likely that difficulties would be encountered in device operation itself.

Therefore, a large number of semiconductor storage devices have been proposed recently where memory cells are arranged in a three-dimensional manner to achieve improved integration of memory devices (see, Patent Document 1; Japanese Patent Laid-Open No. 2003-078044; Patent Document 2: U.S. Pat. No. 5,599,724; and Patent Document 3: U.S. Pat. No. 5,707,885).

One of the conventional semiconductor storage devices where memory cells are arranged in a three-dimensional manner uses transistors with cylinder-type structure (see, Patent Documents 1-3). Those semiconductor storage devices using transistors with cylinder-type structure are provided with multiple layers of polysilicon corresponding to gate electrodes and pillar-like columnar semiconductors. Each of the columnar semiconductors serves as a channel (body) part of each of the transistors. Tunnel insulation layers are provided around the columnar semiconductors. Charge accumulation layers for accumulating charges are further provided around the tunnel insulation layer. Moreover, block insulation layers are formed around the charge accumulation layers. Such configuration including polysilicon, columnar semiconductors, tunnel insulation layers, charge accumulation layers, and block insulation layers is referred to as a "memory string".

When selection transistors are provided above and below the memory string, they are required to have good cut-off characteristics. On the other hand, in view of the yields and costs of the memory devices, it is desirable to use polysilicon for columnar semiconductor layers that represent the body parts of the selection transistors. In this case, however, it is more difficult to control the potential of the columnar semiconductor layers using the gate electrodes than when the columnar semiconductor layers are configured by single-crystal silicon, due to the existence of numerous interface (grain boundary) states in polysilicon. That is, there will be an issue of suppressing leakage current when polysilicon is used for the columnar semiconductor layers.

SUMMARY OF THE INVENTION

One aspect of the present invention provides a non-volatile semiconductor storage device comprising a plurality of memory strings with a plurality of electrically rewritable memory cells connected in series, each of the memory strings comprising: a first columnar semiconductor layer extending in a direction perpendicular to a substrate and having a first hollow extending downward from its upper end; a first insulation layer formed in contact with an outer wall of the first columnar semiconductor layer; a second insulation layer formed on an inner wall of the first columnar semiconductor layer so as to leave the first hollow, the inner wall facing the first hollow; and a plurality of first conductive layers formed to sandwich the first insulation layer with the first columnar semiconductor layer and functioning as control electrodes of the memory cells.

In addition, another aspect of the present invention provides a non-volatile semiconductor storage device comprising a plurality of memory strings with a plurality of electrically rewritable memory cells connected in series and selection transistors connected to respective one ends of the memory strings, each of the selection transistors comprising: a second columnar semiconductor layer extending in a direction perpendicular to a substrate and having a second hollow extending downward from its upper end; a fourth insulation layer formed in contact with an outer wall of the second columnar semiconductor layer; a fifth insulation layer formed on an inner wall of the second columnar semiconductor layer so as to leave the second hollow, the inner wall facing the second hollow; and a second conductive layer formed to sandwich the fourth insulation layer with the second columnar semiconductor layer and functioning as a control electrode of each of the selection transistors.

In addition, still another aspect of the present invention provides a method of manufacturing a non-volatile semiconductor storage device having a plurality of memory strings with a plurality of electrically rewritable memory cells connected in series, forming the memory strings comprising: alternately laminating first interlayer insulation layers and first conductive layers; forming a first hole to penetrate the first interlayer insulation layers and the first conductive layers; forming a first columnar semiconductor layer in the first hole via a first insulation layer, the first columnar semiconductor layer having a first hollow extending downward from its upper end; and forming a second insulation layer on an inner wall of the first columnar semiconductor layer, the inner wall facing the first hollow.

DETAILED DESCRIPTION OF THE EMBODIMENTS

Embodiments of a non-volatile semiconductor storage device according to the present invention will be described below with reference to the accompanying drawings.

First Embodiment (Configuration of Non-Volatile Semiconductor Storage Device 100 in First Embodiment)

Figure 1:
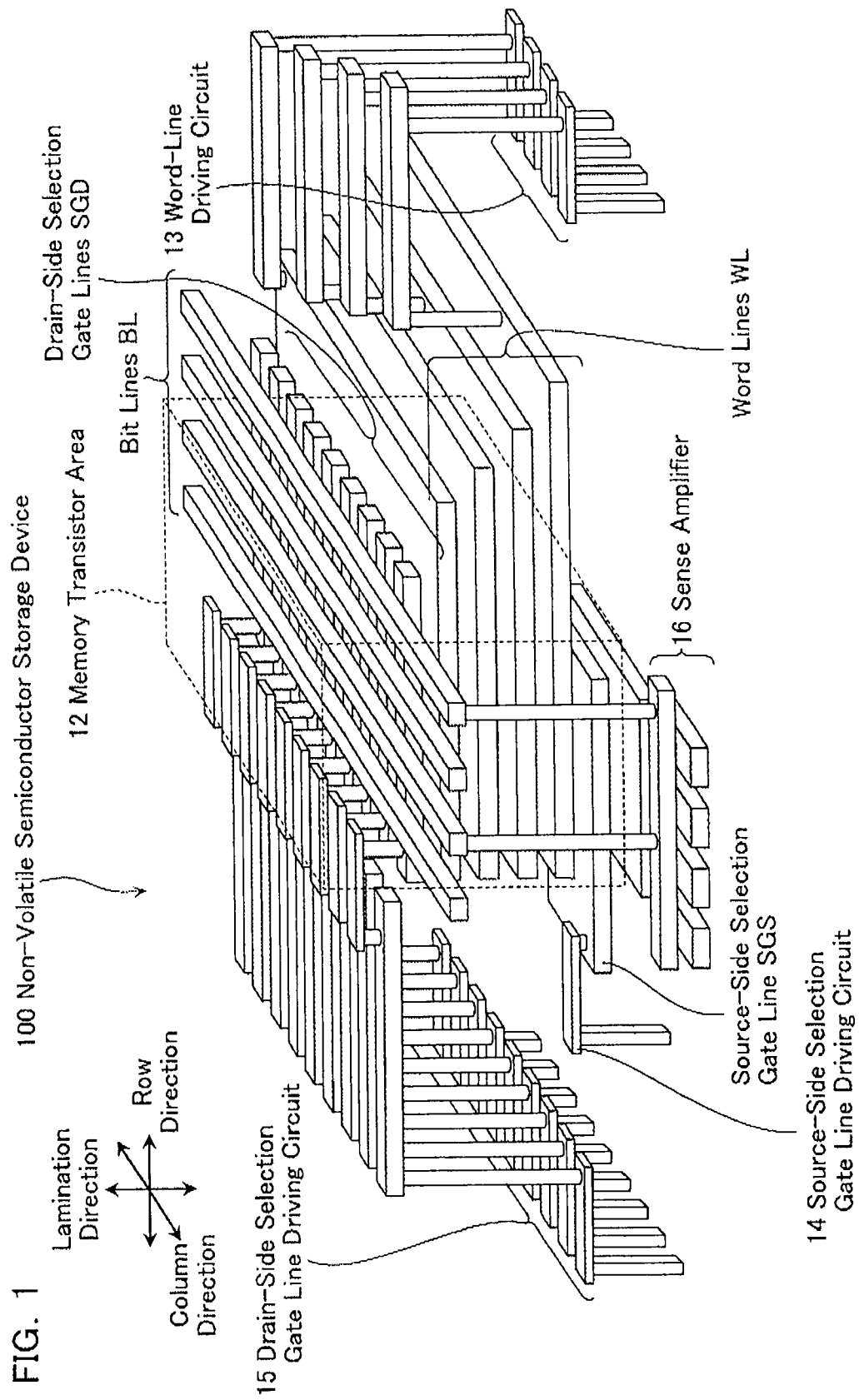
FIG. 1 is a schematic diagram illustrating a configuration of a non-volatile semiconductor storage device according to a first embodiment of the present invention.

FIG. 1 schematically illustrates a non-volatile semiconductor storage device 100 according to a first embodiment of the present invention. As illustrated in FIG. 1, the non-volatile semiconductor storage device 100 according to the first embodiment mainly comprises: a memory transistor area 12; a word-line driving circuit 13; a source-side selection gate line (SGS) driving circuit 14; a drain-side selection gate line (SGD) driving circuit 15; and a sense amplifier 16. The memory transistor area 12 has memory transistors for storing data. The word-line driving circuit 13 controls voltage applied to word lines WL. The source-side selection gate line (SGS) driving circuit 14 controls voltage applied to the source-side selection gate line SGS. The drain-side selection gate line (SGD) driving circuit 15 controls voltage applied to drain-side selection gate lines (SGD). The sense amplifier 16 amplifies a potential read from a memory transistor. In addition to this, the non-volatile semiconductor storage device 100 according to the first embodiment comprises a bit-line driving circuit for controlling voltage applied to bit lines BL and a source-line driving circuit for controlling voltage applied to source lines SL (not illustrated).

In addition, as illustrated in FIG. 1, in the non-volatile semiconductor storage device 100 according to the first embodiment, the memory transistors that configure the memory transistor area 12 are formed by lamination of a plurality of semiconductor layers. In addition, as illustrated in FIG. 1, a word line WL of each layer is formed to extend in a two-dimensional manner in the horizontal direction. The word line WL of each layer has a planar structure of the same layer, respectively, providing a planar plate-like structure.

Figure 2:
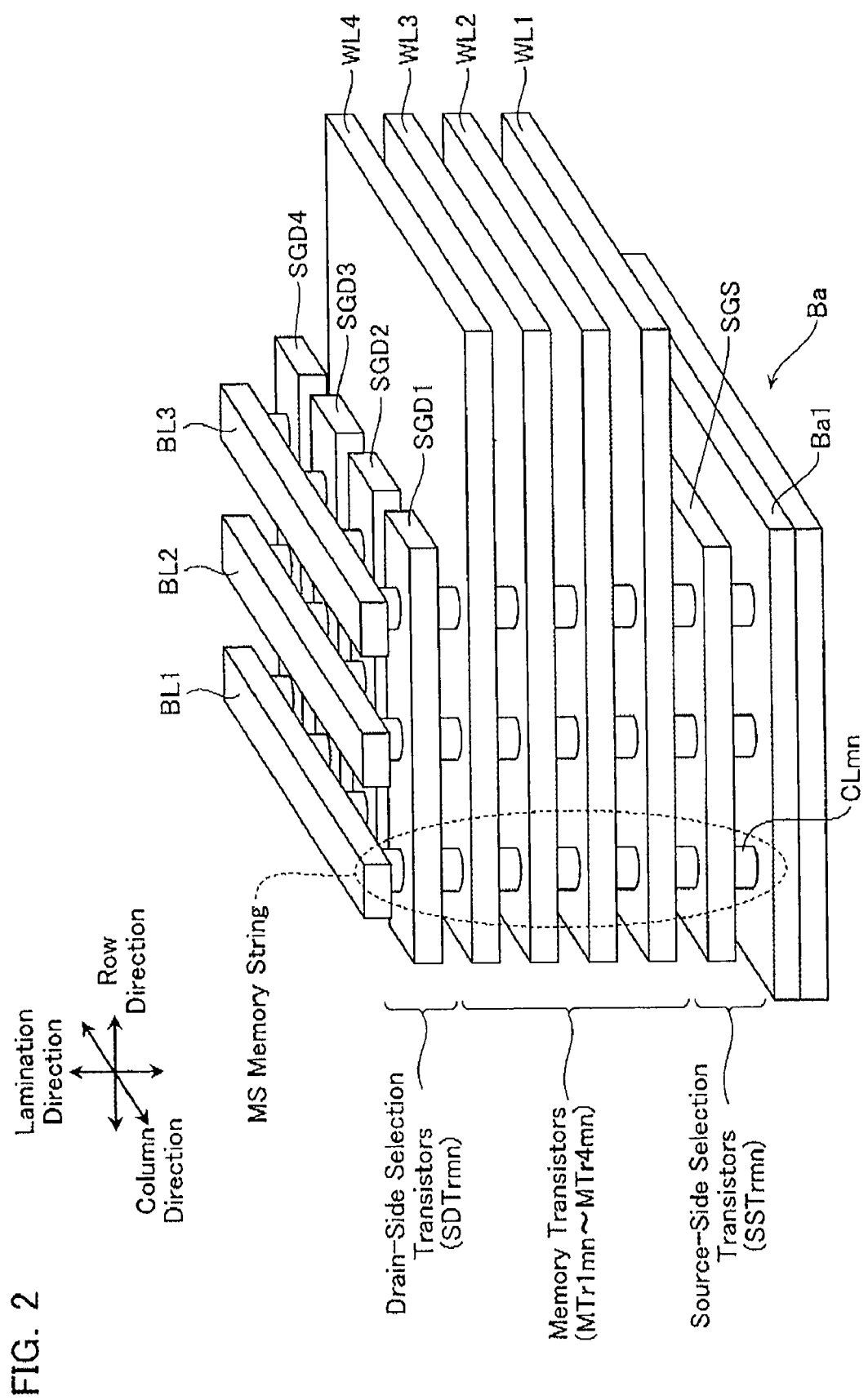
FIG. 2 is a perspective view schematically illustrating a part of the memory transistor area 12 in the non-volatile semiconductor storage device according to the first embodiment of the present invention.

FIG. 2 is a perspective view schematically illustrating a part of the memory transistor area 12 in the non-volatile semiconductor storage device 100 according to the first embodiment. According to the first embodiment, the memory transistor area 12 has m×n (m, n=natural number) memory strings MS, each of which includes memory transistors (MTr1mn to MTr4mn), a source-side selection transistor SSTrmn, and a drain-side selection transistor SDTrmn. In FIG. 2, given that m=3, n=4.

In each of the memory strings MS, each of word lines (WL1 to WL4) connected to the gate of each of the memory transistors MTr1mn to MTr4mn is formed by the same conductive film and used in common therein. That is, in the memory strings MS, all gates of the memory transistors MTr1mn are connected to the word line WL1. In addition, in the memory strings MS, all gates of the memory transistors MTr2mn are connected to the word line WL2. In addition, in the memory strings MS, all gates of the memory transistors MTr3mn are connected to the word line WL3. In addition, in the memory strings MS, all gates of the memory transistors MTr4mn are connected to the word line WL4. As illustrated in FIGS. 1 and 2, in the non-volatile semiconductor storage device 100 according to the first embodiment, each of the word lines WL1 to WL4 is formed to extend in a two-dimensional manner in the horizontal direction and has a planar plate-like structure. In addition, the word lines WL1 to WL4 are arranged substantially perpendicular to the respective memory strings MS. In addition, the row-direction (first direction) and column-direction ends of the word lines WL1 to WL4 are formed in a stepwise manner in relation to each other. Wherein, the row direction represents a direction orthogonal to the vertical direction, and the column direction represents another direction orthogonal to the vertical direction and the row direction.

Each of the memory strings MS has columnar semiconductors CLmn (in the case of FIG. 2, m=1 to 3, n=1 to 4) provided on an n$^+$ area (Ba2, as described later) formed on a P-well area Ba1 of a semiconductor substrate Ba. Each of the columnar semiconductors CLmn is formed in a direction perpendicular to the semiconductor substrate Ba and arranged in a matrix form on the surfaces of the semiconductor substrate Ba and the word lines (WL1 to WL4). Note that each of the columnar semiconductors CLmn has a hollow extending downward from its upper end, as described below. That is, each of the memory strings MS is also arranged in a matrix form within a plane perpendicular to the corresponding columnar semiconductor CLmn. Note that the columnar semiconductors CLmn may be columnar or prismatic in shape. In addition, the columnar semiconductors CLmn include terraced columnar semiconductors.

Further, as illustrated in FIG. 2, provided on the upper portions of the memory strings MS are drain-side selection gate lines SGD with rectangular plate shapes (in the case of FIG. 2, SGD1 to SGD4), which contact columnar semiconductors CLmn via insulating films (not illustrated) to configure respective drain-side selection transistors SDTrmn. The drain-side selection gate lines SGD are insulated and isolated from each other and, unlike the word lines WL1 to WL4, formed to extend in the row direction in a stripe form. In addition, provided at the center in the width direction of the drain-side selection gate lines SGD are columnar semiconductors CLmn, each of which is formed to penetrate that center.

Further, as illustrated in FIG. 2, provided on the lower portions of the memory strings MS is a source-side selection gate line SGS, which contact the columnar semiconductors CLmn via insulating films (not illustrated) to configure respective source-side selection transistors SSTrmn. As with the word lines WL1 to WL4, the source-side selection gate line SGS is formed to extend in a two-dimensional manner in the horizontal direction and it has a planar plate-like structure.

Figure 3:
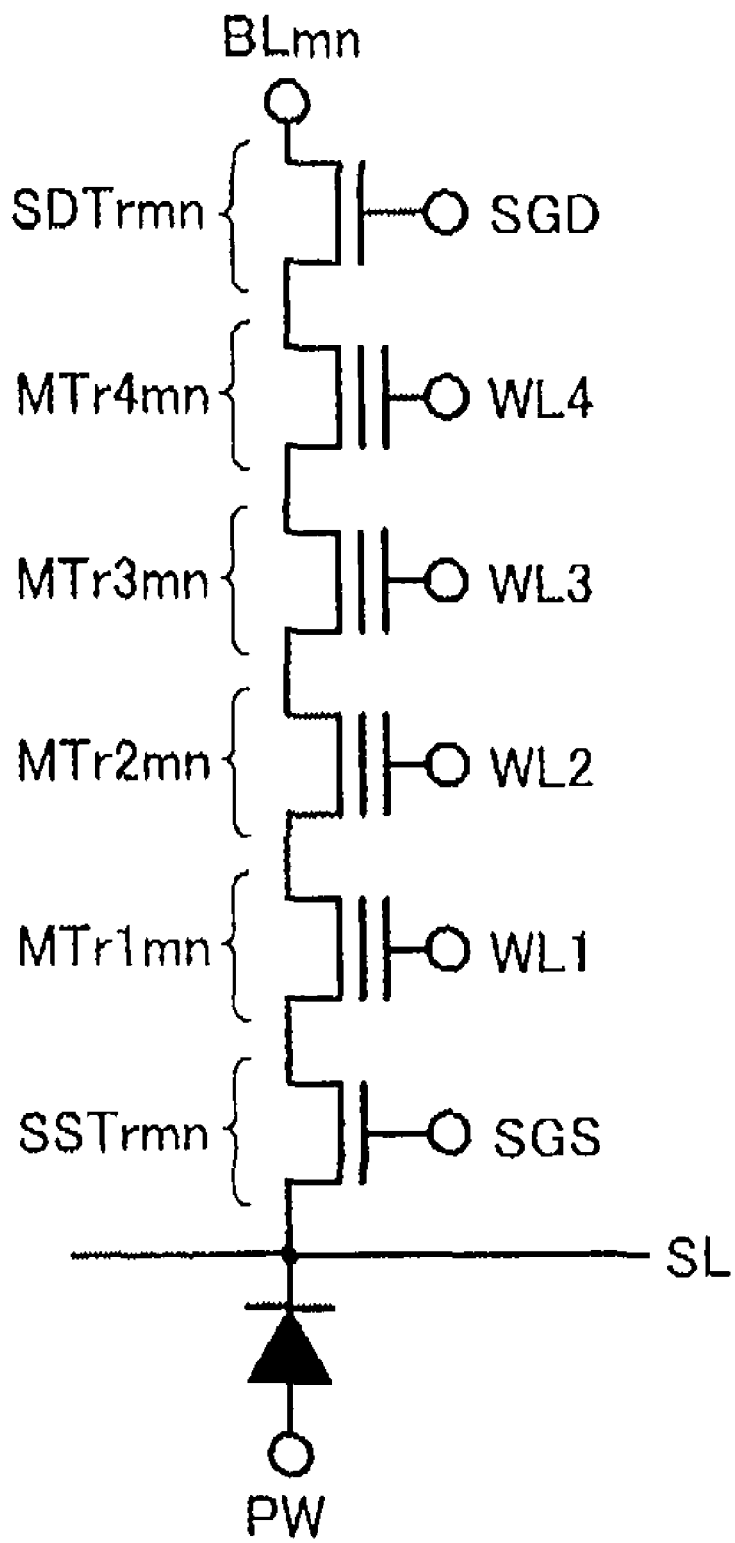
FIG. 3 is a circuit diagram illustrating one memory string MS according to the first embodiment of the present invention.

Referring now to FIGS. 2 and 3, the circuit configuration and operation of the memory strings MS of the first embodiment will be described below. FIG. 3 is a circuit diagram illustrating one memory string MS according to the first embodiment.

As illustrated in FIGS. 2 and 3, in the first embodiment, each of the memory strings MS has four memory transistors MTr1mn to MTr4mn. A source-side selection transistor SSTrmn is provided below each of the memory strings MS. A drain-side selection transistor SDTrmn is provided above each of the memory strings MS. These four memory transistors MTr1mn to MTr4mn as well as the source-side selection transistor SSTrmn and the drain-side selection transistor SDTrmn are connected in series to each other (see FIG. 3). According to the first embodiment, in each of the memory strings MS, a columnar semiconductor CLmn is formed on an $n^+$ area that is formed in a $p^-$ type area (P-well area) Ba1 on the semiconductor substrate Ba.

In addition, a source line SL (an $n^+$ area formed in the P-well area Ba1 on the semiconductor substrate Ba) is connected to the source of each source-side selection transistor SSTrmn. Further, a bit line BL is connected to the drain of each drain-side selection transistor SDTrmn.

Each of the memory transistors MTrmn has a columnar semiconductor CLmn, a charge accumulation layer formed to surround the columnar semiconductor CLmn via an insulation layer, and a word line WL formed to surround the charge accumulation layer. One end of each word line WL that is surrounded by a respective insulating film and contacts a respective charge accumulation layer functions as a control gate electrode CG of each memory transistor MTrmn. The sources and drains of the memory transistors MTrmn are formed at the columnar semiconductors CLmn.

In the non-volatile semiconductor storage device 100 with the above-mentioned configuration, respective voltages of the bit lines BL1 to BL3, the drain-side selection gate lines SGD, the word lines WL1 to WL4, the source-side selection gate line SGS, and the source lines SL are controlled by bit line driving circuits (not illustrated), the drain-side selection gate line driving circuit 15, the word line driving circuits 13, the source-side selection gate line driving circuit 14, and a source line driving circuit (not illustrated). That is, data is read, written and erased by controlling charges of the charge accumulation layer in a predetermined memory transistor MTrmn.

(Specific Configuration of Non-Volatile Semiconductor Storage Device 100 in First Embodiment)

Figure 4:
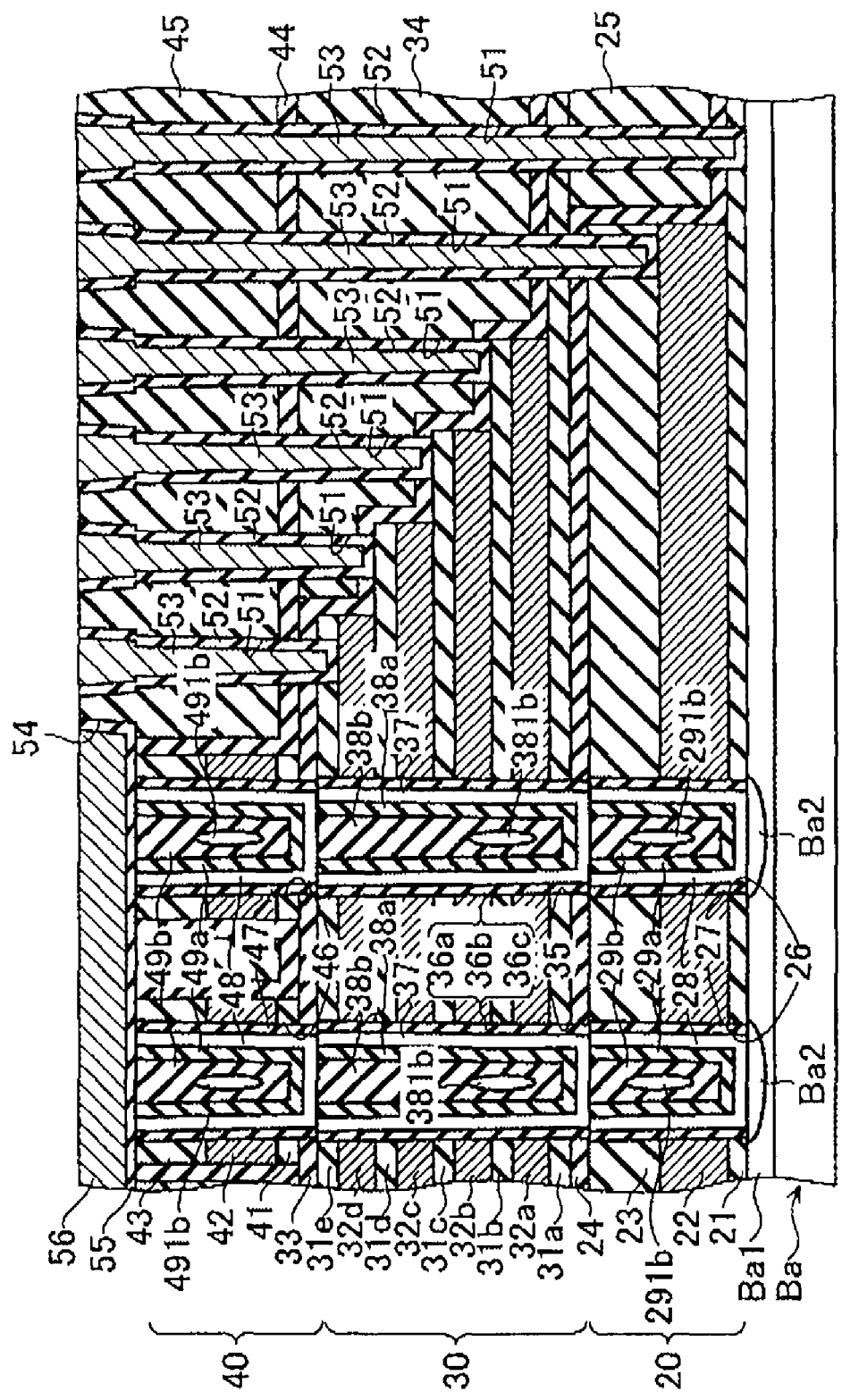
FIG. 4 is a cross-sectional view of the non-volatile semiconductor storage device according to the first embodiment.

Referring now to FIG. 4, a further specific configuration of the non-volatile semiconductor storage device 100 will be described below. FIG. 4 is a cross-sectional view along the row direction of the non-volatile semiconductor storage device according to the first embodiment. As illustrated in FIG. 4, the non-volatile semiconductor storage device 100 has, from lower layer to upper layer on the semiconductor substrate Ba, a source-side selection transistor layer 20, a memory transistor layer 30, and a drain-side selection transistor layer 40. The source-side selection transistor layer 20 functions as a source-side selection transistor SSTrmn. The memory transistor layer 30 functions as a memory transistor MTrmn. The drain-side selection transistor layer 40 functions as a drain-side selection transistor SDTrmn.

A $p^-$ type area (P-well area) Ba1 which becomes a source line SL is formed on the semiconductor substrate Ba. In addition, an $n^+$ area Ba2 is selectively formed on the $p^-$ type area Ba1.

The source-side selection transistor layer 20 has source-side first insulation layers 21 that are formed on the semiconductor substrate Ba, source-side conductive layers 22 that are formed on the top surfaces of the source-side first insulation layers 21, source-side second insulation layers 23 that are formed on the top surfaces of the source-side conductive layers 22, and source-side isolation/insulation layers 24 that are formed on the top surfaces of the source-side second insulation layers 23.

The source-side first insulation layers 21, the source-side conductive layers 22, and the source-side second insulation layers 23 are each formed to extend in a two-dimensional manner in the horizontal direction. The source-side isolation/insulation layers 24 are formed to cover in part the top surfaces of the source-side first insulation layers 21 as well as edges in the row and column directions of the source-side conductive layers 22 and the source-side second insulation layers 23. In addition, interlayer insulation layers 25 are formed in the source-side selection transistor layer 20, ranging from the top of the source-side isolation/insulation layers 24 formed on the top surfaces of the source-side first insulation layers 21 to the top of the source-side isolation/insulation layers 24 formed on the top surfaces of the source-side second insulation layers 23.

The source-side first insulation layers 21 and the source-side second insulation layers 23 are composed of silicon oxide ($SiO_2$). The source-side conductive layers 22 are composed of polysilicon (p-Si). The source-side isolation/insulation layers 24 are composed of silicon nitride (SiN). The interlayer insulation layers 25 are composed of silicon oxide ($SiO_2$). Note that one end of each of the source-side conductive layers 22 functions as a control gate of the source-side selection transistor SSTrmn.

In addition, the source-side selection transistor layer 20 has source-side holes 26 at positions matching the corresponding $n^+$ areas Ba2 that are formed to penetrate the source-side isolation/insulation layer 24, the source-side second insulation layer 23, the source-side conductive layer 22, and the source-side first insulation layer 21. A source-side gate insulation layer 27, a source-side columnar semiconductor layer 28, a source-side-hole first insulation layer 29a, and a source-side-hole second insulation layer 29b are sequentially provided on the sidewall of each source-side hole 26.

The source-side gate insulation layers 27 are formed in a hollow cylindrical shape so as to come in contact with the source-side first insulation layers 21, the source-side conductive layers 22, and the source-side second insulation layers 23. The source-side columnar semiconductor layers 28 are formed in a bottomed cylindrical shape so as to come in contact with the source-side gate insulation layers 27. In other words, each of the source-side columnar semiconductor layers 28 extends in a direction perpendicular to the semiconductor substrate Ba and has a hollow extending downward from its upper end. The source-side-hole first insulation layers 29a are formed in a bottomed cylindrical shape so as to come in contact with the inner walls of the source-side columnar semiconductor layers 28 (i.e., the sidewalls facing the hollows in the source-side columnar semiconductor layers 28). In other words, the source-side-hole first insulation layers 29a are formed to leave the hollows in the source-side columnar semiconductor layers 28 (without filling up the entire hollows). The source-side-hole second insulation layers 29b are formed in a columnar shape so as to come in contact with the source-side-hole first insulation layers 29a. In other words, the source-side-hole second insulation layers 29b are formed to fill up the hollows in the source-side columnar semiconductor layers 28. In addition, a void 291b is formed in each of the source-side-hole second insulation layers 29b.

The source-side gate insulation layers 27 are formed by silicon oxide ($SiO_2$). The source-side columnar semiconductor layers 28 are formed by polysilicon (p-Si). The source-side-hole first insulation layers 29a are formed by silicon oxide ($SiO_2$). The source-side-hole second insulation layers 29b are formed by silicon nitride (SiN).

Note that the configuration of the source-side conductive layers 22 in the source-side selection transistor layer 20 is restated as follows: each of the source-side conductive layers 22 is formed to sandwich a source-side gate insulation layer 27 between a corresponding source-side columnar semiconductor layer 28.

The memory transistor layer 30 has first to fifth insulation layers between word lines 31a to 31e that are provided over the source-side isolation/insulation layers 24 and the interlayer insulation layers 25, first to fourth word-line conductive layers 32a to 32d that are provided one above the other with the first to fifth insulation layers between word lines 31a to 31e, and memory isolation/insulation layers 33 that are provided on the fifth insulation layer between word lines 31e.

The first to fifth insulation layers between word lines 31a to 31e as well as the first to fourth word-line conductive layers 32a to 32d are formed to extend in a two-dimensional manner in the horizontal direction, and formed in a stepwise manner in relation to each other at the ends in the row and column directions. The memory isolation/insulation layers 33 are formed to cover the respective ends in the row and column directions of the first to fifth insulation layers between word lines 31a to 31e as well as the first to fourth word-line conductive layers 32a to 32d. In addition, interlayer insulation layers 34 are formed in the memory transistor layer 30, ranging from the top of the memory isolation/insulation layers 33 formed on the top surfaces of the first insulation layer between word lines 31a to the top of the memory isolation/insulation layers 33 formed on the top surfaces of the fifth insulation layer between word lines 31e.

The first to fifth insulation layers between word lines 31a to 31e are composed of silicon oxide ($SiO_2$). The first to fourth word-line conductive layers 32a to 32d are composed of polysilicon (p-Si). The memory isolation/insulation layers 33 are composed of silicon nitride (SiN). The interlayer insulation layers 34 are composed of silicon oxide ($SiO_2$). Note that the first to fourth word-line conductive layers 32a to 32d function as the word lines WL1 to WL4.

In addition, the memory transistor layer 30 has memory holes 35 formed therein so as to penetrate the first to fifth insulation layers between word lines 31a to 31e, the first to fourth word-line conductive layers 32a to 32d, and the source-side isolation/insulation layer 24. The memory holes 35 are provided at positions matching the source-side holes 26. A block insulation layer 36a, a charge accumulation layer 36b, a tunnel insulation layer 36c, a memory columnar semiconductor layer 37, a memory-hole first insulation layer 38a, and a memory-hole second insulation layer 38b are sequentially provided on the sidewall of each memory hole 35.

The block insulation layers 36a are formed in a hollow cylindrical shape so as to come in contact with the first to fifth insulation layers between word lines 31a to 31e and the first to fourth word-line conductive layers 32a to 32d. Similarly, the charge accumulation layers 36b are formed in a hollow cylindrical shape so as to come in contact with the block insulation layers 36a, while the tunnel insulation layers 36c are formed in a hollow cylindrical shape so as to come in contact with the charge accumulation layers 36b. The memory columnar semiconductor layers 37 are formed in a bottomed cylindrical shape so as to come in contact with the tunnel insulation layers 36c. In other words, each of the memory columnar semiconductor layers 37 extends in a direction perpendicular to the semiconductor substrate Ba and has a hollow extending downward from its upper end. The memory-hole first insulation layers 38a are formed in a bottomed cylindrical shape so as to come in contact with the inner walls of the memory columnar semiconductor layers 37 (i.e., the sidewalls facing the hollows in the memory columnar semiconductor layers 37). In other words, the memory-hole first insulation layers 38a are formed to leave the hollows in the memory columnar semiconductor layers 37 (without filling up the entire hollows). The memory-hole second insulation layers 38b are formed in a columnar shape so as to come in contact with the memory-hole first insulation layers 38a. In other words, the memory-hole second insulation layers 38b are formed to fill up the hollows in the memory columnar semiconductor layers 37. In addition, a plurality of voids 381b are formed in the memory-hole second insulation layers 38b.

The block insulation layers 36a are formed by silicon oxide ($SiO_2$). The charge accumulation layers 36b are formed by silicon nitride (SiN). The tunnel insulation layers 36c are formed by silicon oxide ($SiO_2$). The memory columnar semiconductor layers 37 are formed by polysilicon (p-Si). The memory-hole first insulation layers 38a are formed by silicon oxide ($SiO_2$). The memory-hole second insulation layers 38b are formed by silicon nitride (SiN).

Note that the configuration of the first to fourth word-line conductive layers 32a to 32d in the memory transistor layer 30 is restates as follows: each of the first to fourth word-line conductive layers 32a to 32d is formed to sandwich a tunnel insulation layer 36c, a charge accumulation layer 36b, and a block insulation layer 36a between a corresponding memory columnar semiconductor layer 37.

The drain-side selection transistor layer 40 has drain-side first insulation layers 41 that are provided on the top surfaces of the memory columnar semiconductor layers 37, drain-side conductive layers 42 that are provided on the top surfaces of the drain-side first insulation layers 41, drain-side second insulation layers 43 that are provided on the top surfaces of the drain-side conductive layers 42, and drain-side isolation/insulation layers 44 that are provided on the top surfaces of the drain-side second insulation layers 43.

The drain-side first insulation layers 41, the drain-side conductive layers 42, and the drain-side second insulation layers 43 are provided at positions matching the upper portions of the memory columnar semiconductor layers 37, and formed to extend in the row direction in a stripe form. The drain-side isolation/insulation layers 44 are formed to cover the respective side surfaces of the drain-side first insulation layers 41, the drain-side conductive layers 42, and the drain-side second insulation layers 43, as well as the respective top surfaces of the memory isolation/insulation layers 33 and the interlayer insulation layers 34. In addition, an interlayer insulation layer 45 is formed in the drain-side selection transistor layer 40, ranging from the top of the drain-side isolation/insulation layers 44 formed on the top surfaces of the interlayer insulation layers 34 to above the drain-side isolation/insulation layers 44 formed on the top surfaces of the drain-side second insulation layers 43.

The drain-side first insulation layers 41 and the drain-side second insulation layers 43 are formed by silicon oxide ($SiO_2$). The drain-side conductive layers 42 are formed by polysilicon (p-Si). The drain-side isolation/insulation layers 44 are formed by silicon nitride (SiN). The interlayer insulation layer 45 is formed by silicon oxide ($SiO_2$). Note that one ends of the drain-side conductive layers 42 function as control gates of the above-mentioned drain-side selection transistors SDTrmn.

In addition, the drain-side selection transistor layer 40 has drain-side holes 46 formed therein so as to penetrate the drain-side isolation/insulation layer 44, the drain-side second insulation layer 43, the drain-side conductive layer 42, the drain-side first insulation layer 41, and the memory isolation/insulation layer 33. The drain-side holes 46 are provided at positions matching the memory holes 35. A drain-side gate insulation layer 47, a drain-side columnar semiconductor layer 48, a drain-side-hole first insulation layer 49a, and a drain-side-hole second insulation layer 49b are sequentially provided on the sidewall of each drain-side hole 46.

The drain-side gate insulation layers 47 are formed in a hollow cylindrical shape so as to come in contact with the drain-side first insulation layers 41, the drain-side conductive layers 42, and the drain-side second insulation layers 43. The drain-side columnar semiconductor layers 48 are formed in a bottomed cylindrical shape so as to come in contact with the drain-side gate insulation layers 47. In other words, each of the drain-side columnar semiconductor layers 48 extends in a direction perpendicular to the semiconductor substrate Ba and has a hollow extending downward from its upper end. The drain-side-hole first insulation layers 49a are formed in a bottomed cylindrical shape so as to come in contact with the inner walls of the drain-side columnar semiconductor layers 48 (i.e., the sidewalls facing the hollows in the drain-side columnar semiconductor layers 48). In other words, the drain-side-hole first insulation layers 49a are formed to leave the hollows in the drain-side columnar semiconductor layers 48 (without filling up the entire hollows). The drain-side-hole second insulation layers 49b are formed in a columnar shape so as to come in contact with the drain-side-hole first insulation layers 49a. In other words, the drain-side-hole second insulation layers 49b are formed to fill up the hollows in the drain-side columnar semiconductor layers 48. In addition, a void 491b is formed in each of the drain-side-hole second insulation layers 49b.

The drain-side gate insulation layers 47 are formed by silicon oxide ($SiO_2$). The drain-side columnar semiconductor layers 48 are formed by polysilicon (p-Si). The drain-side-hole first insulation layers 49a are formed by silicon oxide ($SiO_2$). The drain-side-hole second insulation layers 49b are formed by silicon nitride (SiN).

Note that the configuration of the drain-side conductive layers 42 in the drain-side selection transistor layer 40 is restated as follows: each of the drain-side conductive layers 42 is formed to sandwich a drain-side gate insulation layer 47 between a corresponding drain-side columnar semiconductor layer 48.

In addition, plug holes 51 are formed in the source-side selection transistor layer 20, the memory transistor layer 30, and the drain-side selection transistor layer 40, ranging from the top surface of the drain-side selection transistor layer 40 to the P-well area Ba1, to the source-side conductive layers 22, and to the first to fourth word-line conductive layers 32a to 32d, respectively. Plug conductive layers 53 are formed in the plug holes 51 via barrier metal layers 52. The barrier metal layers 52 are formed by titanium nitride (TiN). The plug conductive layers 53 are formed by tungsten (W).

In addition, a wiring trench 54 is formed to extend in the row direction, at a position matching the drain-side columnar semiconductor layers 48 on the top surface of the drain-side selection transistor layer, such that the interlayer insulation layer 45 is dug down to a predetermined depth. A wiring conductive layer 56 is formed in the wiring trench 54 via a barrier metal layer 55. The barrier metal layer 55 is formed by titanium nitride (TiN). The wiring conductive layer 56 is formed by tungsten (W).

(Manufacturing Process of Non-Volatile Semiconductor Storage Device 100 in First Embodiment)

Referring now to FIGS. 5 through 20, a manufacturing process of the non-volatile semiconductor storage device 100 according to the first embodiment will be described below.

Figure 5:
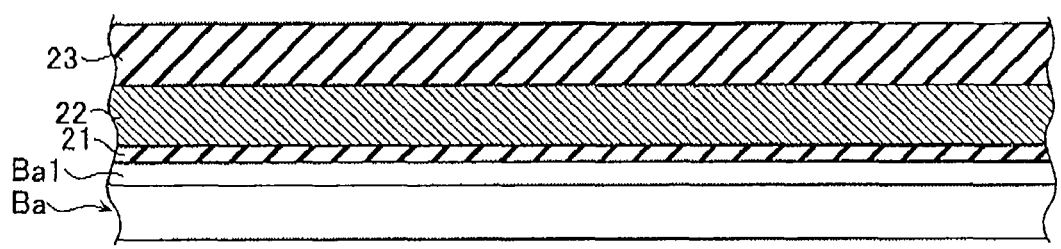
FIG. 5 is a cross-sectional view of the non-volatile semiconductor storage device in a manufacturing process according to the first embodiment.

Firstly, as illustrated in FIG. 5, a F-well area Ba1 is formed on the semiconductor substrate Ba, and then silicon oxide (e.g., 20 nm), polysilicon (e.g., 100 nm), and silicon oxide (e.g., 200 nm) are sequentially laminated thereon to form a source-side first insulation layer 21, a source-side conductive layer 22, and a source-side second insulation layer 23, respectively.

Figure 6:
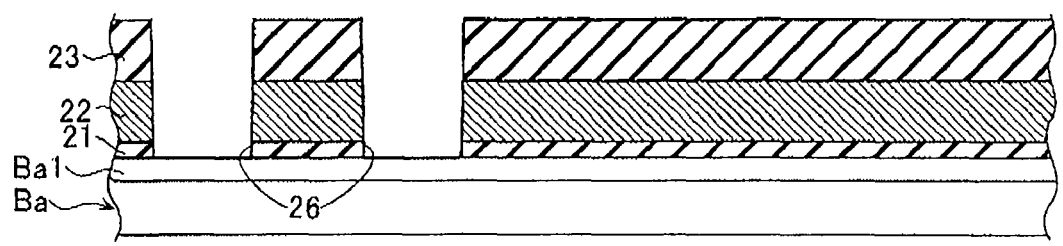
FIG. 6 is a cross-sectional view of the non-volatile semiconductor storage device in the manufacturing process according to the first embodiment.

Then, as illustrated in FIG. 6, source-side holes 26 are formed on the P-well area Ba1 at a predetermined pitch so as to penetrate the source-side second insulation layer 23, the source-side conductive layer 22, and the source-side first insulation layer 21, respectively. In this case, each of the source-side holes 26 has an aperture diameter of, e.g., 50 nm.

Figure 7:
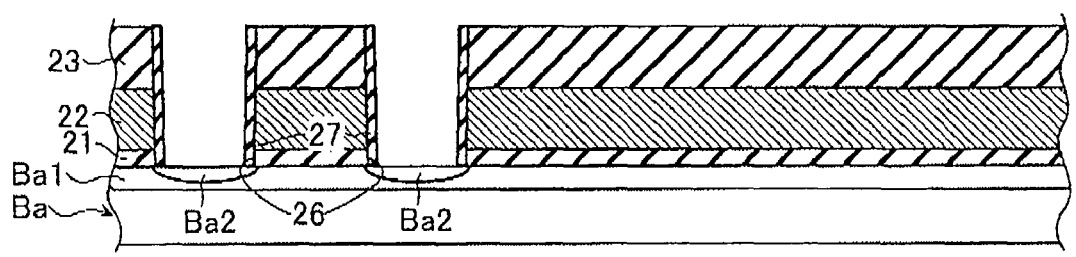
FIG. 7 is a cross-sectional view of the non-volatile semiconductor storage device in the manufacturing process according to the first embodiment.

Then, as illustrated in FIG. 7, for example, arsenic (As) ion is injected onto the bottom surfaces of the source-side holes 26 (the P-well area Ba1) to form $n^+$ areas Ba2 on the P-well area Ba1. Thereafter, silicon oxide ($SiO_2$) is deposited within the source-side holes 26 and any silicon oxide ($SiO_2$) is removed by Reactive Ion Etching (RIE) that is formed on the bottom portions of the source-side holes 26, thereby forming source-side gate insulation layers 27. Further, hydrofluoric acid treatment is performed to remove any natural oxide film on the bottom portions of the source-side holes 26.

Figure 8:
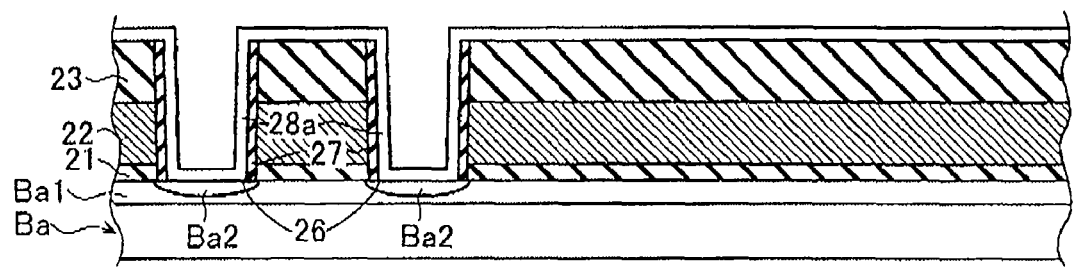
FIG. 8 is a cross-sectional view of the non-volatile semiconductor storage device in the manufacturing process according to the first embodiment.

Then, as illustrated in FIG. 8, an amorphous silicon layer 28a is formed by deposition of amorphous silicon (a-Si) (e.g., 10 nm). In this case, the amorphous silicon layer 28a is deposited within the source-side holes 26 so that hollows are left with a diameter of on the order of 20 nm.

Figure 9:
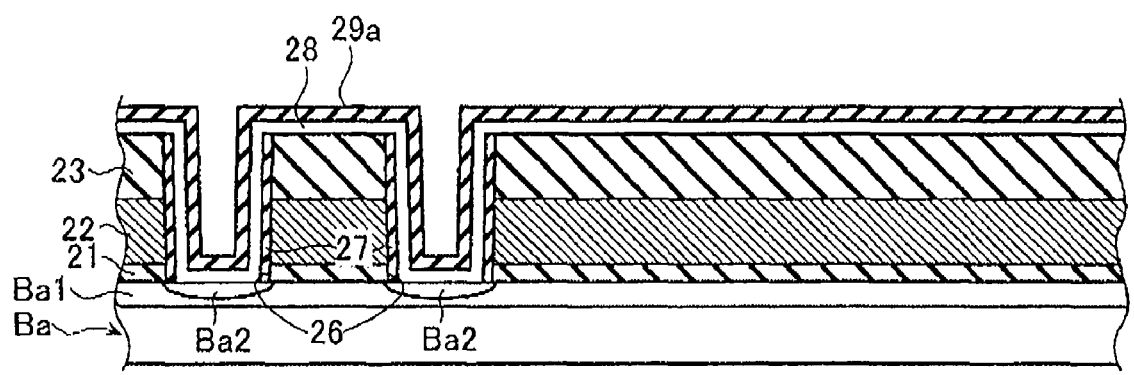
FIG. 9 is a cross-sectional view of the non-volatile semiconductor storage device in the manufacturing process according to the first embodiment.

Then, as illustrated in FIG. 9, the surface of the amorphous silicon layer 28a is oxidized by low-temperature plasma at a temperature of not more than 500 degrees C., and a silicon oxide film is grown on the surface of the amorphous silicon layer 28a (e.g., on the order of 7 nm) to form a source-side-hole first insulation layer 29a. In this case, the amorphous silicon layer 28a is consumed on the order of 3 nm. Further, the inner portion of the amorphous silicon layer 28a that is left without oxidization is polycrystallized in a nitride atmosphere at 600 degrees C. to provide polysilicon (p-Si). As a result, a source-side columnar semiconductor layer 28 is formed. Then, it is desirable to perform heat treatment in an oxidizing atmosphere at on the order of 800 degrees C.

Figure 10:
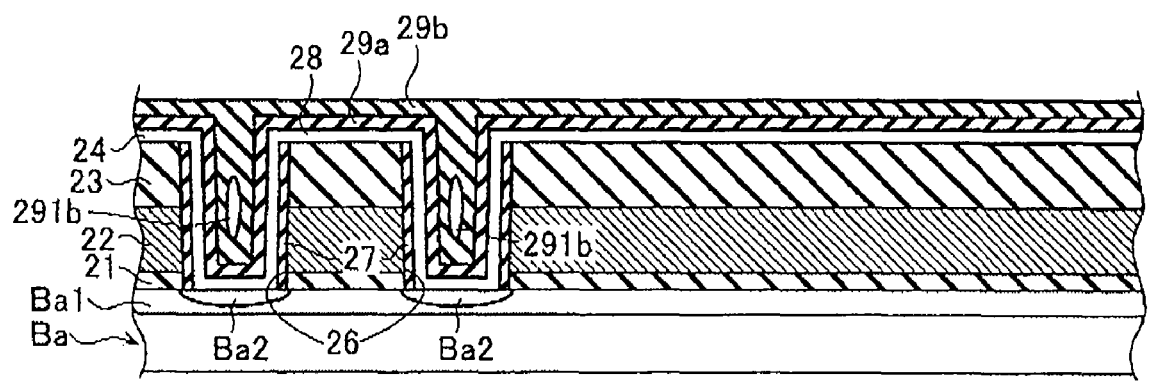
FIG. 10 is a cross-sectional view of the non-volatile semiconductor storage device in the manufacturing process according to the first embodiment.

Then, as illustrated in FIG. 10, silicon nitride (SiN) is deposited on the source-side-hole first insulation layer 29a to fill up the hollows thereon, thereby forming a source-side-hole second insulation layer 29b. In this case, voids 291b are formed in the source-side-hole second insulation layer 29b.

Figure 11:
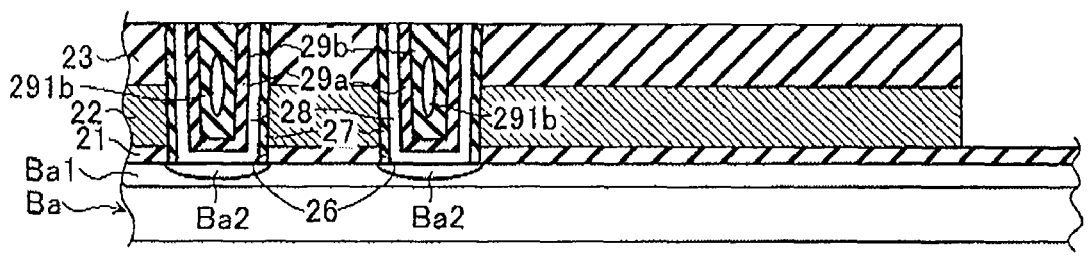
FIG. 11 is a cross-sectional view of the non-volatile semiconductor storage device in the manufacturing process according to the first embodiment.

Then, as illustrated in FIG. 11, those portions of the source-side-hole second insulation layer 29b, the source-side-hole first insulation layer 29a, and the source-side columnar semiconductor layer 28 are removed by RIE that are formed on the source-side second insulation layers 23. In addition, those portions of the source-side first insulation layers 21, the source-side conductive layers 22, and the source-side second insulation layers 23 are removed that are formed in areas in the row and column directions spaced a predetermined distance respectively from the center of the memory transistor area 12.

Figure 12:
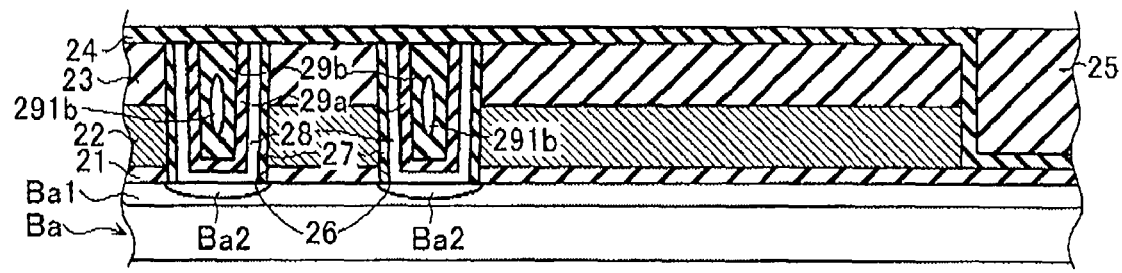
FIG. 12 is a cross-sectional view of the non-volatile semiconductor storage device in the manufacturing process according to the first embodiment.

Then, as illustrated in FIG. 12, silicon nitride (SiN) and silicon oxide ($SiO_2$) are laminated thereon and then its upper portion is flattened by Chemical Mechanical Polishing (CMP). As a result, a source-side isolation/insulation layer 24 an interlayer insulation layer 25 are formed.

Figure 13:
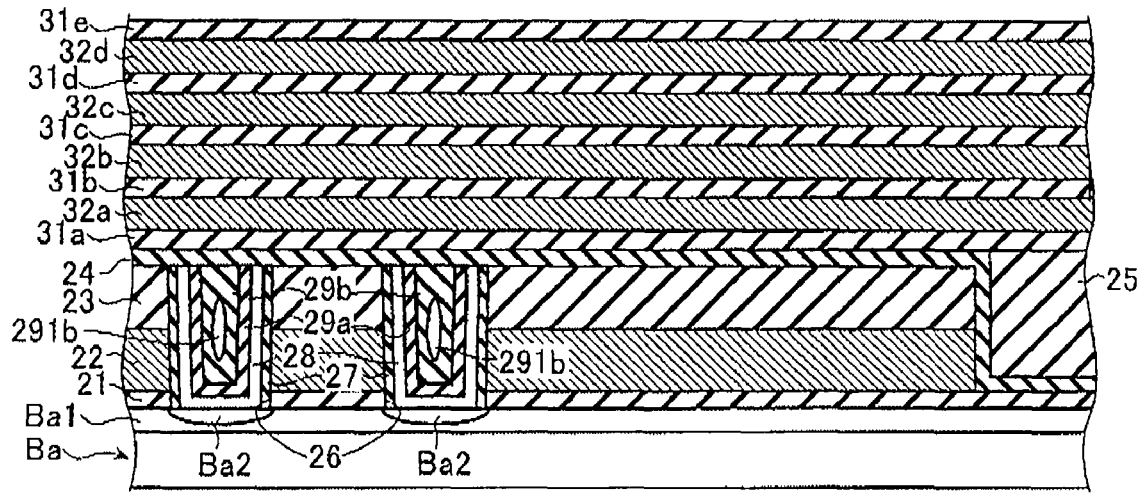
FIG. 13 is a cross-sectional view of the non-volatile semiconductor storage device in the manufacturing process according to the first embodiment.

Then, as illustrated in FIG. 13, silicon oxide ($SiO_2$) and polysilicon (p-Si) are alternately laminated on the source-side isolation/insulation layer 24 and the interlayer insulation layer 25 to form first to fifth insulation layers between word lines 31a to 31e and first to fourth word-line conductive layers 32a to 32d.

Figure 14:
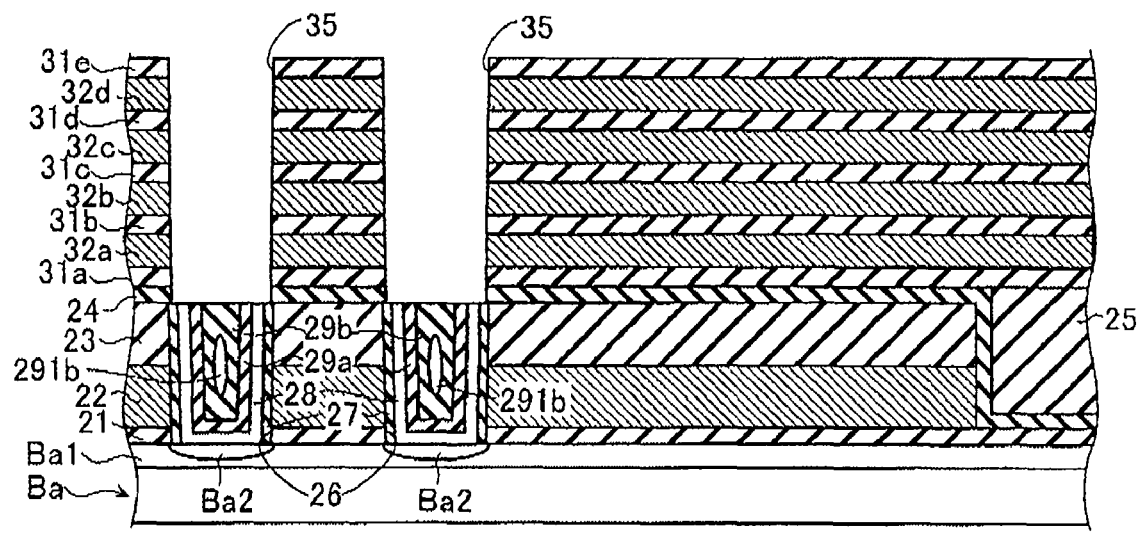
FIG. 14 is a cross-sectional view of the non-volatile semiconductor storage device in the manufacturing process according to the first embodiment.

Then, as illustrated in FIG. 14, memory holes 35 are formed at positions matching the source-side holes 26 so as to penetrate the first to fifth insulation layers between word lines 31a to 31e, the first to fourth word-line conductive layers 32a to 32d, and the source-side isolation/insulation layer 24.

Figure 15:
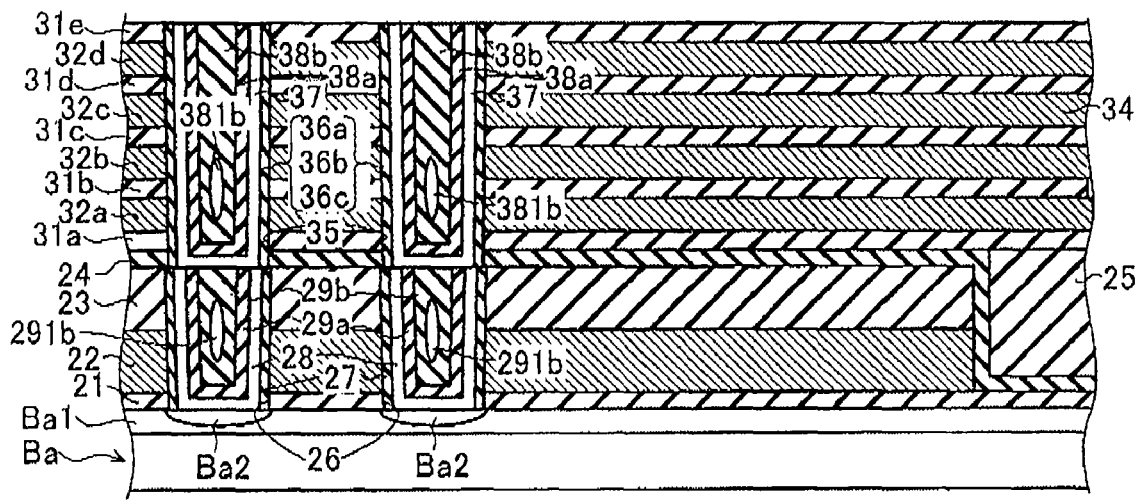
FIG. 15 is a cross-sectional view of the non-volatile semiconductor storage device in the manufacturing process according to the first embodiment.

Then, as illustrated in FIG. 15, silicon oxide (SiO$_2$), silicon nitride (SiN), and silicon oxide (SiO$_2$) are deposited within the memory holes 35. Then, silicon oxide (SiO$_2$), silicon nitride (SiN), and silicon oxide (SiO$_2$) are removed by RIE that are formed on the upper portions of the fifth insulation layer between word lines 31e and the bottom portions of the memory holes 35. As a result, block insulation layers 36a, charge accumulation layers 36b, and tunnel insulation layers 36c are formed. Subsequently, as with the manufacturing process of the source-side selection transistor layer 20, amorphous silicon is deposited on the surfaces of the tunnel insulation layers 36c and the surface of amorphous silicon is then oxidized by low-temperature plasma to form memory-hole first insulation layers 38a. In addition, the inner portion of the amorphous silicon layer that is left without oxidization is polycrystallized to provide polysilicon, by which memory columnar semiconductor layers 37 are formed. Further, silicon nitride (SiN) is deposited on the memory-hole first insulation layers 38a to fill up the hollows thereon, thereby forming memory-hole second insulation layers 38b. In this case, a void 381b is formed in each of the memory-hole second insulation layers 38b.

Figure 16:
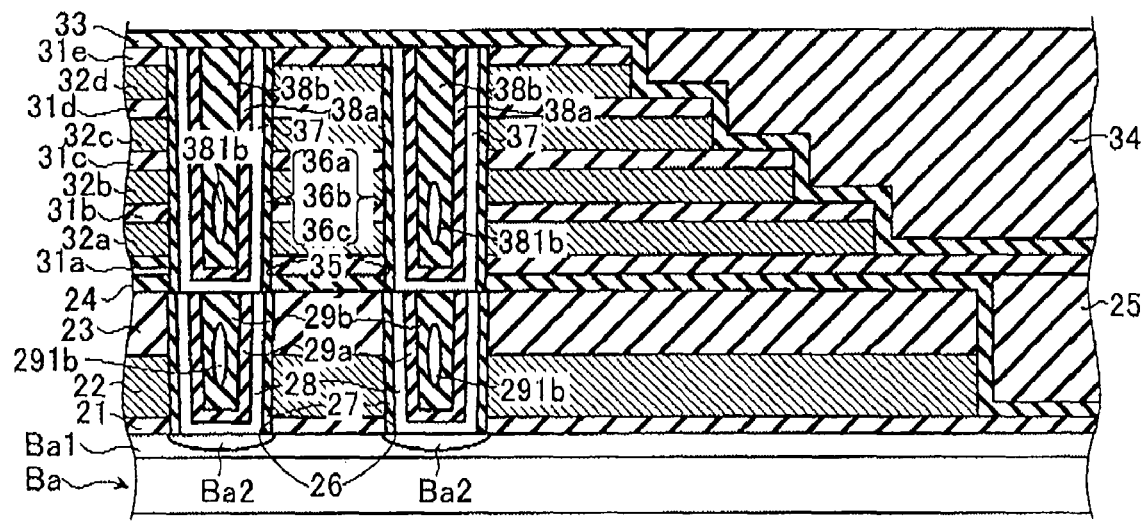
FIG. 16 is a cross-sectional view of the non-volatile semiconductor storage device in the manufacturing process according to the first embodiment.

Then, as illustrated in FIG. 16, the first to fifth insulation layers between word lines 31a to 31e and the first to fourth word-line conductive layers 32a to 32d are processed in a stepwise manner in relation to each other at positions spaced a predetermined distance respectively from the center of the memory transistor area 12. Thereafter, silicon nitride (SiN) and silicon oxide (SiO$_2$) are deposited and CMP process is performed thereon, by which a memory isolation/insulation layer 33 and an interlayer insulation layer 34 are formed.

Figure 17:
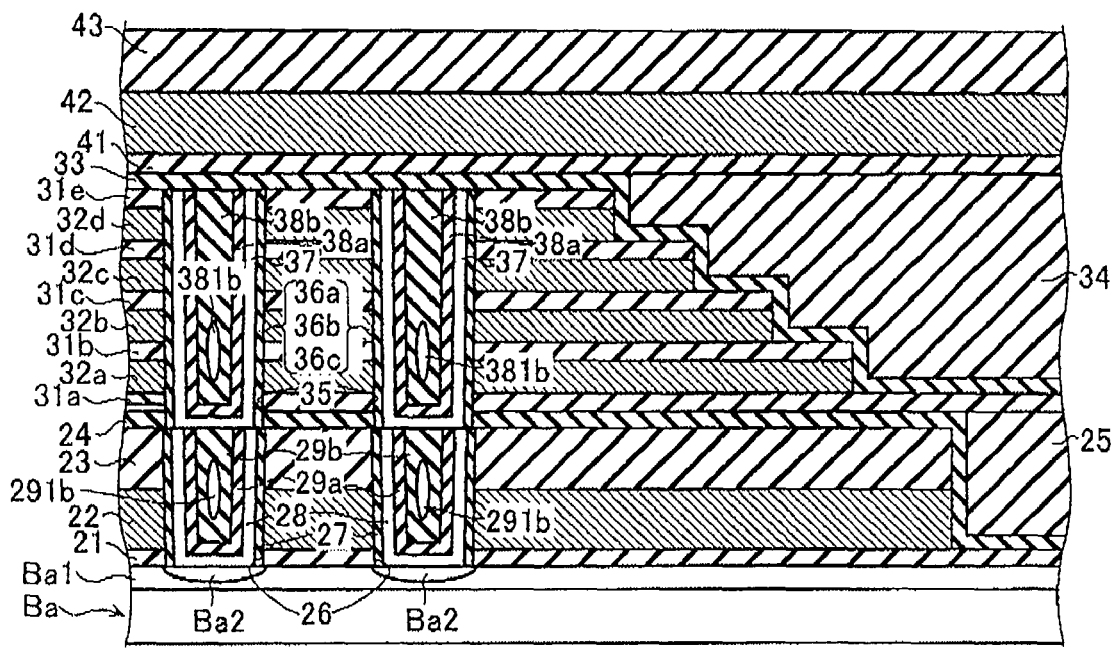
FIG. 17 is a cross-sectional view of the non-volatile semiconductor storage device in the manufacturing process according to the first embodiment.

Then, as illustrated in FIG. 17, silicon oxide (SiO$_2$), polysilicon (p-Si), and silicon oxide (SiO$_2$) are deposited on the memory isolation/insulation layers 33 and the interlayer insulation layers 34 to form a drain-side first insulation layer 41, a drain-side conductive layer 42, and a drain-side second insulation layer 43.

Figure 18:
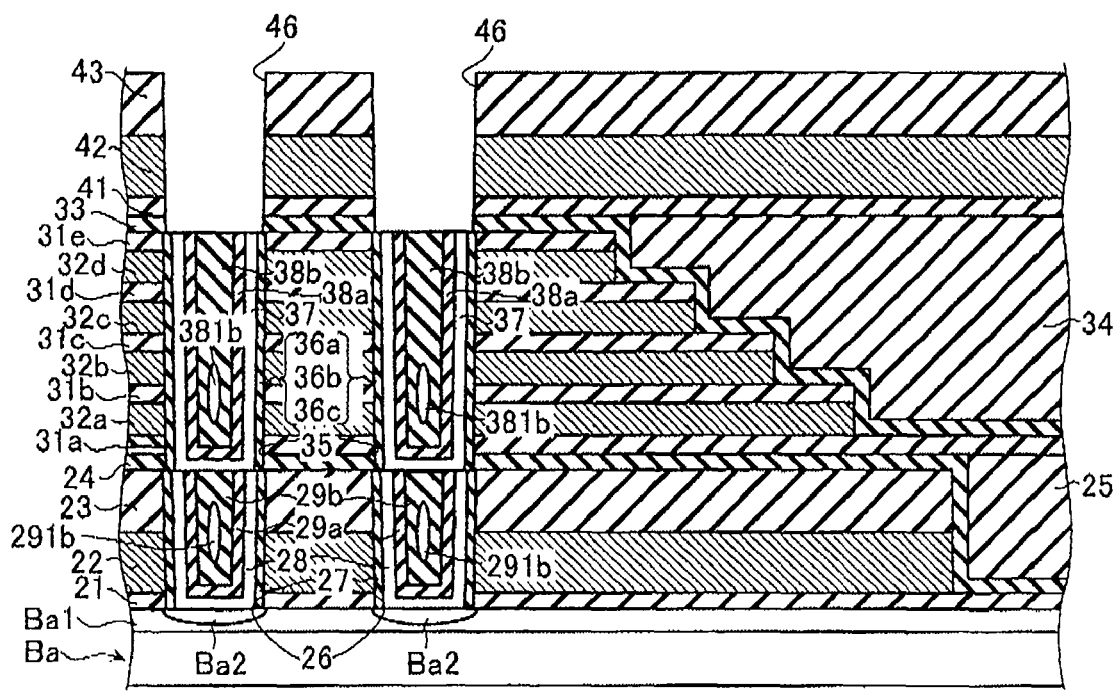
FIG. 18 is a cross-sectional view of the non-volatile semiconductor storage device in the manufacturing process according to the first embodiment.

Then, as illustrated in FIG. 18, drain-side holes 46 are formed to penetrate the drain-side second insulation layer 43, the drain-side conductive layer 42, the drain-side first insulation layer 41, and the memory isolation/insulation layer 33 at positions matching the memory holes 35.

Figure 19:
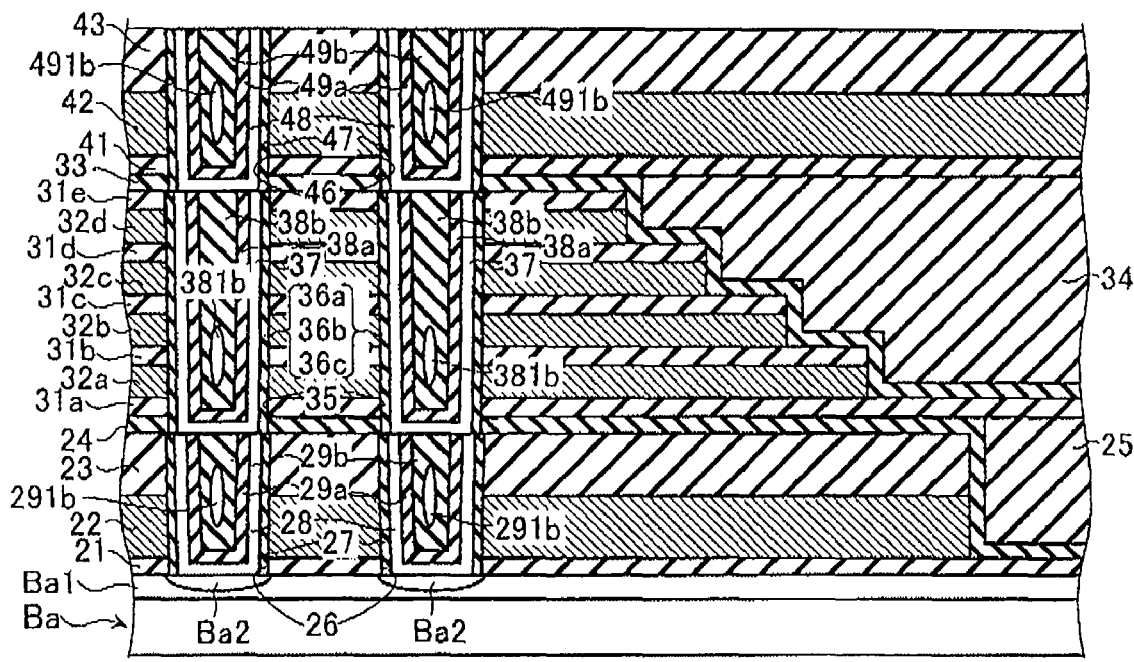
FIG. 19 is a cross-sectional view of the non-volatile semiconductor storage device in the manufacturing process according to the first embodiment.

Then, as illustrated in FIG. 19, silicon oxide (SiO$_2$) is deposited within the drain-side holes 46 and any silicon oxide (SiO$_2$) is removed by RIE that is formed on the upper portions of the drain-side second insulation layers 43 and the bottom portions of the drain-side holes 46, thereby forming drain-side gate insulation layers 47. Subsequently, as with the manufacturing process of the source-side selection transistor layer 20, amorphous silicon is deposited on the surfaces of the drain-side gate insulation layers 47 and the surface of amorphous silicon is then oxidized by low-temperature plasma to form drain-side-hole first insulation layers 49a. In addition, the inner portion of the amorphous silicon layer that is left without oxidization is polycrystallized to provide polysilicon, by which drain-side columnar semiconductor layers 48 are formed. Further, silicon nitride (SiN) is deposited on the drain-side-hole first insulation layers 49a to fill up the hollows thereon, thereby forming drain-side-hole second insulation layers 49b. In this case, a void 491b is formed in each of the drain-side-hole second insulation layers 49b.

Figure 20:
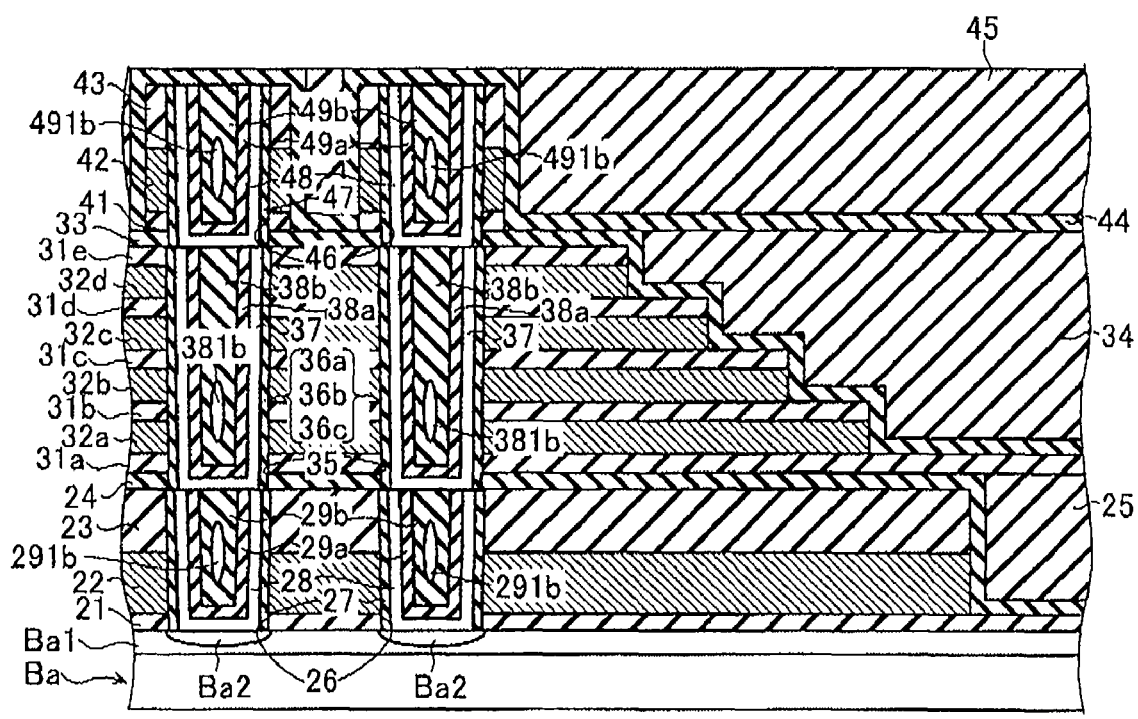
FIG. 20 is a cross-sectional view of the non-volatile semiconductor storage device in the manufacturing process according to the first embodiment.

Then, as illustrated in FIG. 20, the drain-side second insulation layers 43, the drain-side conductive layers 42, and the drain-side first insulation layers 41 are positioned at a predetermined pitch in the row direction and processed in a stripe form in the column direction. Thereafter, silicon nitride (SiN) and silicon oxide (SiO$_2$) are deposited and CMP process is performed thereon, by which a drain-side isolation/insulation layer 44 and an interlayer insulation layer 45 are formed.

Then, plug holes 51 are formed, ranging from the top surface of the drain-side selection transistor layer 40 to the P-well area Ba1, to the source-side conductive layers 22, and to the first to fourth word-line conductive layers 32a to 32d, respectively. Then, a wiring trench 54 is formed to extend in the row direction, at a position matching the drain-side columnar semiconductor layers 48, such that the interlayer insulation layer 45 is dug down to a predetermined depth.

Then, titanium nitride (TiN) and tungsten (W) are deposited within the plug holes 51 and the wiring trench 54. As a result, barrier metal layers 52 and plug conductive layers 53 are formed in the plug holes 51 and a barrier metal layer 55 and a wiring conductive layer 56 are formed in the wiring trench 54, thereby forming the non-volatile semiconductor storage device 100 as illustrated in FIG. 4.

(Advantages of Non-Volatile Semiconductor Storage Device 100 in First Embodiment)

Advantages of the non-volatile semiconductor storage device 100 according to the first embodiment will now be described below. As can be seen from the above lamination structure, the non-volatile semiconductor storage device 100 according to the first embodiment may achieve high integration. In addition, as described in the above manufacturing processes of the non-volatile semiconductor storage device 100, each layer corresponding to a respective memory transistor MTrmn, source-side selection transistors SSTrmn, and drain-side selection transistors SDTrmn may be manufactured in a predetermined number of lithography steps, irrespective of the number of laminated layers. That is, the non-volatile semiconductor storage device 100 may be manufactured at a lower cost.

In addition, in the non-volatile semiconductor storage device 100 according to the first embodiment of the present invention, the body part of each source-side selection transistor SSTrmn is configured by a source-side columnar semiconductor layer 28 that is composed of polysilicon and has a hollow therein. In addition, the body part of each memory transistor MTrmn is configured by a memory columnar semiconductor layer 37 that is composed of polysilicon and has a hollow. In addition, the body part of each drain-side selection transistor SDTrmn is configured by a drain-side columnar semiconductor layer 48 that is composed of polysilicon and has a hollow.

In this case, polysilicon has numerous interface (grain boundary) states due to the existence of numerous grain boundary states in that polysilicon. For example, if the source-side columnar semiconductor layers, the memory columnar semiconductor layers, and the drain-side columnar semiconductor layers that are formed by polysilicon have a columnar shape without any hollow and if they are formed with a larger diameter, then charges are trapped by their interface states. That is, it becomes more difficult to control respective potentials of the source-side columnar semiconductor layers 28, the memory columnar semiconductor layers 37, and the drain-side columnar semiconductor layers 48, which would cause leakage current.

On the other hand, in the non-volatile semiconductor storage device 100 according to the first embodiment of the present invention, as described above, the source-side columnar semiconductor layers 28, the memory columnar semiconductor layers 37, and the drain-side columnar semiconductor layers 48 have hollows therein and they are formed with a smaller thickness in the diameter direction, respectively. Accordingly, the absolute amount of the grain boundary states contained in polysilicon would be reduced for the source-side columnar semiconductor layers 28, the memory columnar semiconductor layers 37, and the drain-side columnar semiconductor layers 48. That is, the absolute amount of the interface potentials may be reduced. Therefore, this allows for control of respective potentials of the source-side columnar semiconductor layers 28, the memory columnar semiconductor layers 37, and the drain-side columnar semiconductor layers 48, which may reduce leakage current.

Further, in the non-volatile semiconductor storage device 100 according to the first embodiment of the present invention, the source-side-hole first insulation layers 29a are formed on the inner walls of the source-side columnar semiconductor layers 28. In addition, the memory-hole first insulation layers 38a are formed on the inner walls of the memory columnar semiconductor layers 37. In addition, the drain-side-hole first insulation layers 49a are formed on the inner walls of the drain-side columnar semiconductor layers 48. Accordingly, with the above-mentioned configuration, the number of dangling bonds in silicon (Si) atoms can be reduced that exist adjacent to the respective inner walls of the source-side columnar semiconductor layers 28, the memory columnar semiconductor layers 37, and the drain-side columnar semiconductor layers 48, which may further reduce leakage current.

In addition, the non-volatile semiconductor storage device 100 according to the first embodiment of the present invention has the source-side-hole second insulation layers 29b provided therein to fill up the hollows on the source-side-hole first insulation layers 29a. The memory-hole second insulation layers 38b are also provided to fill up the hollows on the memory-hole first insulation layers 38a. The drain-side-hole second insulation layers 49b are also provided to fill up the hollows on the drain-side-hole first insulation layers 49a. Accordingly, the above-mentioned configuration may facilitate the process of forming the memory transistor layer 30, as compared with when the hollows are provided on the source-side-hole first insulation layers 29a. It may also facilitate the process of forming the drain-side selection transistor layer 40, as compared with when the hollows are provided on the memory-hole first insulation layers 38a. It may also facilitate the process of forming the wiring conductive layer 56, etc., as compared with when the hollows are provided on the drain-side-hole first insulation layers 49a.

In addition, the non-volatile semiconductor storage device 100 according to the first embodiment of the present invention has a void 291b provided in each of the source-side-hole second insulation layers 29b. A void 381b is also provided in each of the memory-hole second insulation layers 38b. A void 491b is also provided in each of the drain-side-hole second insulation layers 49b. Accordingly, the above-mentioned configuration allows such stress to be absorbed by the voids 291b that is caused by any volume expansion in the source-side columnar semiconductor layers 28 due to oxidization. It also allows such stress to be absorbed by the voids 381b that is caused by any volume expansion in the memory columnar semiconductor layers 37 due to oxidization. It also allows such stress to be absorbed by the voids 491b that is caused by any volume expansion in the drain-side columnar semiconductor layers 48 due to oxidization.

In addition, the source-side-hole second insulation layers 29b, the memory-hole second insulation layers 38b, and the drain-side-hole second insulation layers 49b are formed by silicon nitride (SiN). Accordingly, such effects can be expected that the compressional stress of the silicon nitride may compensate the above-mentioned stress due to volume expansion.

In addition, in the method of manufacturing the non-volatile semiconductor storage device 100 according to the first embodiment of the present invention, by oxidizing amorphous silicon (a-Si) with low-temperature plasma rather than crystallizing (i.e., without providing polysilicon (p-Si)), the source-side-hole first insulation layers ($SiO_2$) 29a, the memory-hole first insulation layers ($SiO_2$) 38a, and the drain-side-hole first insulation layers ($SiO_2$) 49a may be formed with better evenness. Likewise, in this case, the surface of the residual amorphous silicon (a-Si) after low-temperature plasma oxidation will also provide better evenness. Accordingly, the source-side columnar semiconductor layers 28, the memory columnar semiconductor layers 37, and the drain-side columnar semiconductor layers 48 with the residual amorphous silicon (a-Si) crystallized (i.e., with polysilicon (p-Si)) provide better evenness. Therefore, with the above-mentioned better evenness, the method of manufacturing the non-volatile semiconductor storage device 100 according to the first embodiment of the present invention allows variations in characteristics to be reduced in the source-side columnar semiconductor layers 28, the memory columnar semiconductor layers 37, and the drain-side columnar semiconductor layers 48.

As can be seen from the above, the non-volatile semiconductor storage device 100 according to the first embodiment has the advantages of reduced interface states in the columnar semiconductor layers, improved transistor characteristics, and reduced variations in characteristics.

Second Embodiment (Specific Configuration of Non-Volatile Semiconductor Storage Device in Second Embodiment)

Figure 21:
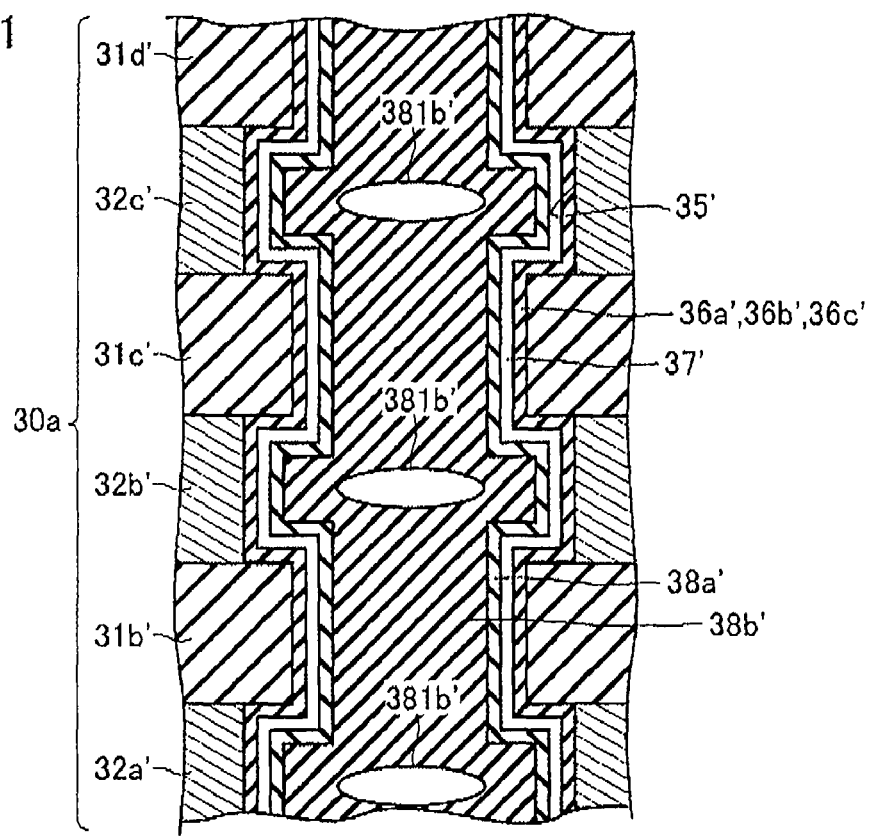
FIG. 21 is an enlarged view of a part of a non-volatile semiconductor storage device according to a second embodiment.

Referring now to FIG. 21, a specific configuration of a non-volatile semiconductor storage device according to a second embodiment of the present invention will be described below. Note that the same reference numerals represent the same components as the first embodiment and description thereof will be omitted in the second embodiment.

As illustrated in FIG. 21, the non-volatile semiconductor storage device according to the second embodiment has a memory transistor layer 30a different from the first embodiment. Unlike the first embodiment, the memory transistor layer 30a has a memory hole 35' with its sidewall formed in a concavo-convex pattern.

The sidewalls of first to fifth insulation layers between word lines 31a' to 31e' facing the memory hole 35' are formed to protrude inward as compared with the sidewalls of first to fourth word-line conductive layers 32a' to 32d' facing the memory hole 35'. In other words, the sidewalls of the first to fourth word-line conductive layers 32a' to 32d' facing the memory hole 35' are formed to caved outward as compared with the sidewalls of the first to fifth insulation layers between word lines 31a' to 31e' facing the memory hole 35'.

The inner and outer walls of a block insulation layer 36a', a charge accumulation layer 36b', a tunnel insulation layer 36c', a memory columnar semiconductor layer 37', and a memory-hole first insulation layer 38a' are formed in a concavo-convex pattern along the shape of these sidewalls facing the memory hole 35'. In addition, a memory-hole second insulation layer 38b' has a protruded shape at each position in the lamination direction where the first to fourth word-line conductive layers 32a' to 32d' are provided. Voids 381b' that are included in the memory-hole second insulation layer 38b' are formed at positions in the lamination direction where the first to fourth word-line conductive layers 32a' to 32d' are provided (corresponding to the protruded portions of the memory-hole second insulation layer 38b').

(Advantages of Non-Volatile Semiconductor Storage Device in Second Embodiment)

Advantages of the non-volatile semiconductor storage device according to the second embodiment will now be described below. The non-volatile semiconductor storage device according to the second embodiment has the same advantages as the first embodiment. In addition, the non-volatile semiconductor storage device according to the second embodiment may utilize the shape of the memory hole 35' to form the voids 381b' at positions in the lamination direction where the first to fourth word-line conductive layers 32a' to 32d' are provided. Accordingly, the stress associated with volume expansion may be mitigated by the voids 381b' that are located near the respective edges of the first to fourth word-line conductive layers 32a' to 32d'.

Note that while the memory transistor layer 30a is only illustrated in the second embodiment, in the source-side selection transistor layer 20, the sidewalls of the first and second source-side insulation layers 21 and 23 facing the source-side holes 26 may be formed to protrude inward as compared with the sidewalls of the source-side conductive layers 22 facing the source-side holes 26. In addition, in the drain-side selection transistor layer 40, the sidewalls of the first and second drain-side insulation layers 41 and 43 facing the drain-side holes 46 may be formed to protrude inward as compared with the sidewalls of the drain-side conductive layers 42 facing the drain-side holes 46.

Third Embodiment (Specific Configuration of Non-Volatile Semiconductor Storage Device in Third Embodiment)

Figure 22:
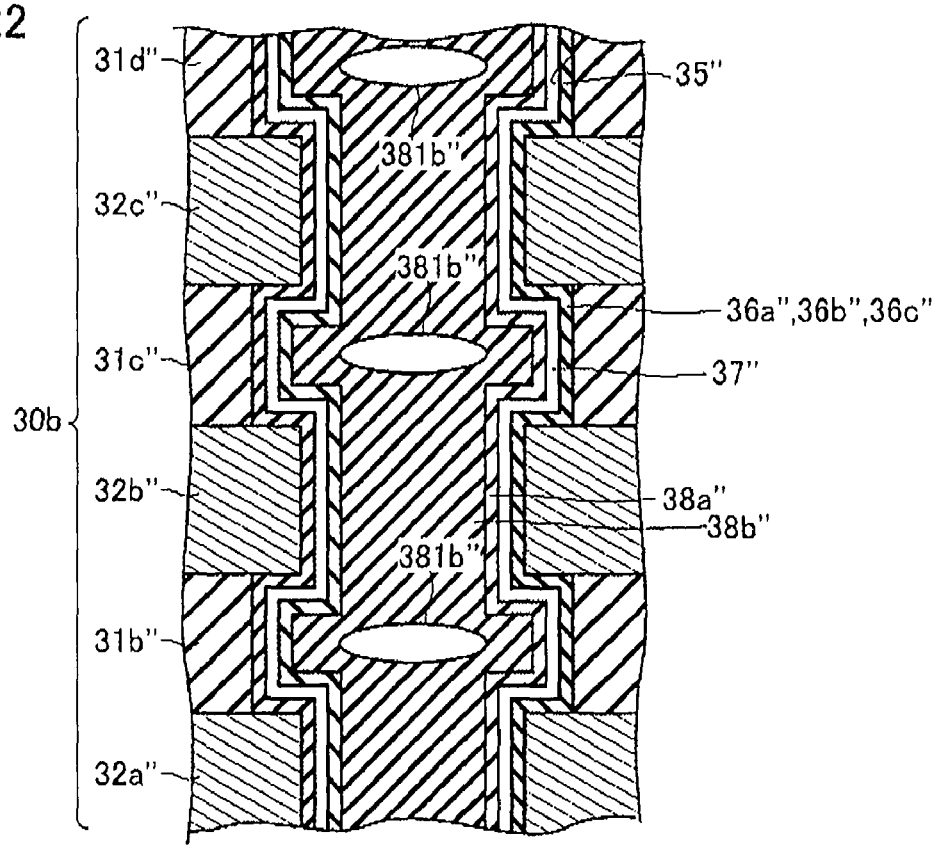
FIG. 22 is an enlarged view of a part of a non-volatile semiconductor storage device according to a third embodiment.

Referring now to FIG. 22, a specific configuration of a non-volatile semiconductor storage device according to a third embodiment of the present invention will be described below. Note that the same reference numerals represent the same components as the first embodiment and description thereof will be omitted in the third embodiment.

As illustrated in FIG. 22, the non-volatile semiconductor storage device according to the third embodiment has a memory transistor layer 30b different from the first and second embodiments. The memory transistor layer 30b has a memory hole 35" with its sidewall formed in a concavo-convex pattern at positions different from the second embodiment.

The sidewalls of first to fifth insulation layers between word lines 31a" to 31e" facing the memory hole 35" are formed to be caved outward as compared with the sidewalls of first to fourth word-line conductive layers 32a" to 32d" facing the memory hole 35". In other words, the sidewalls of the first to fourth word-line conductive layers 32a" to 32d" facing the memory hole 35" are formed to protrude inward as compared with the sidewalls of the first to fifth insulation layers between word lines 31a" to 31e" facing the memory hole 35".

The inner and outer walls of a block insulation layer 36a", a charge accumulation layer 36b", a tunnel insulation layer 36c", a memory columnar semiconductor layer 37", and a memory-hole first insulation layer 38a" are formed in a concavo-convex pattern along the shape of these sidewalls facing the memory hole 35". In addition, a memory-hole second insulation layer 38b" has a protruded shape at each position in the lamination direction where the first to fifth insulation layers between word lines 31a" to 31e" are provided. Voids 381b" that are included in the memory-hole second insulation layer 38b" are formed at positions in the lamination direction where the first to fifth insulation layers between word lines 31a" to 31e" are provided (corresponding to the protruded portions of the memory-hole second insulation layer 38b").

(Advantages of Non-Volatile Semiconductor Storage Device in Third Embodiment)

Advantages of the non-volatile semiconductor storage device according to the third embodiment will now be described below. The non-volatile semiconductor storage device according to the third embodiment has the same advantages as the first embodiment. In addition, the non-volatile semiconductor storage device according to the third embodiment may utilize the shape of the memory hole 35" to form the voids 381b" at positions in the lamination direction where the first to fifth insulation layers between word lines 31a" to 31e" are provided. Accordingly, the stress associated with volume expansion may be mitigated by the voids 381b" that are located near the respective edges of the first to fifth insulation layers between word lines 31a" to 31e".

Note that while the memory transistor layer 30b is only illustrated in the third embodiment, in the source-side selection transistor layer 20, the sidewalls of the first and second source-side insulation layers 21 and 23 facing the source-side holes 26 may be formed to be caved outward as compared with the sidewalls of the source-side conductive layers 22 facing the source-side holes 26. In addition, in the drain-side selection transistor layer 40, the sidewalls of the first and second drain-side insulation layers 41 and 43 facing the drain-side holes 46 may be formed to be caved outward as compared with the sidewalls of the drain-side conductive layers 42 facing the drain-side holes 46.

Fourth Embodiment (Specific Configuration of Non-Volatile Semiconductor Storage Device in Fourth Embodiment)

Figure 23:
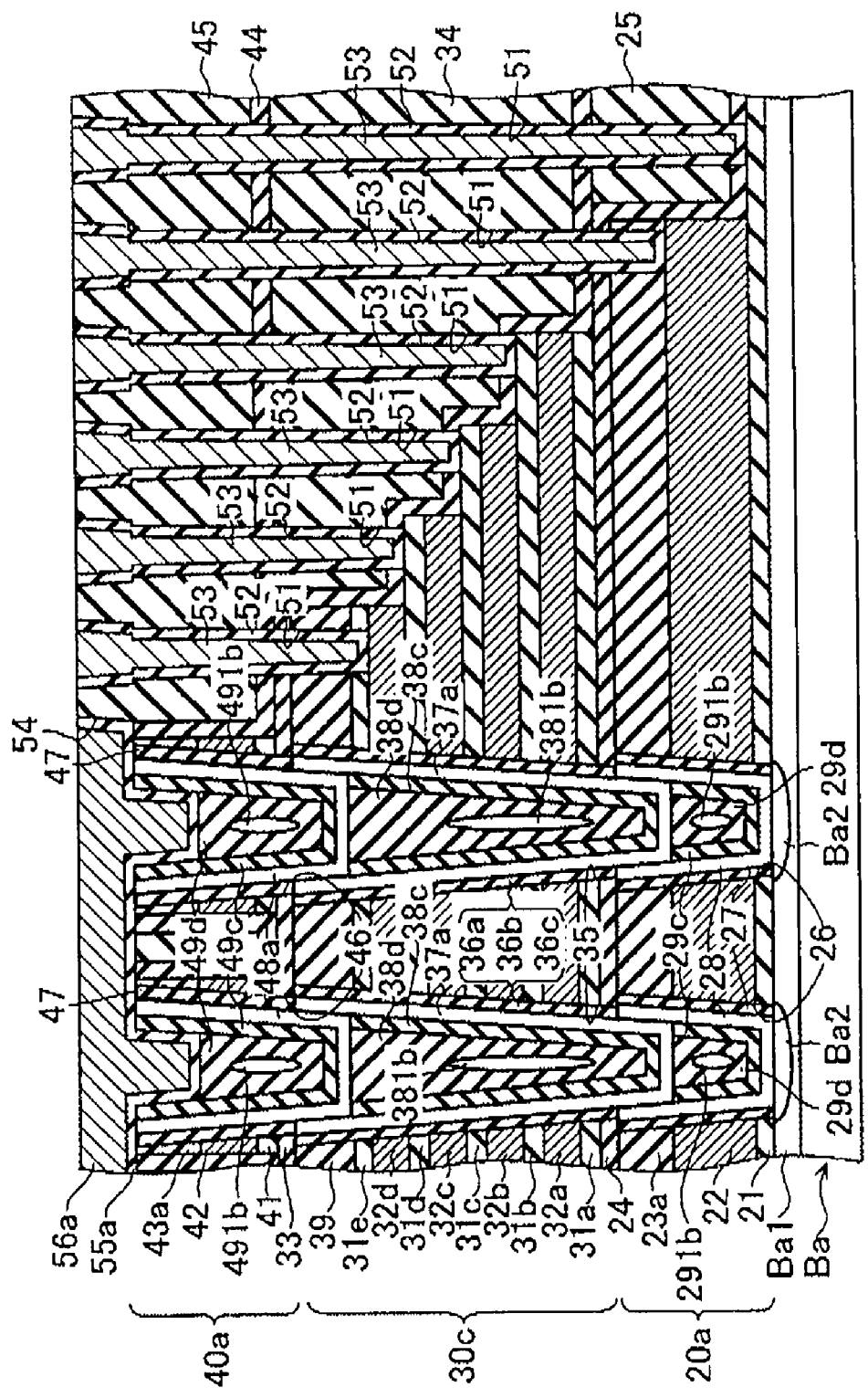
FIG. 23 is a cross-sectional view of a non-volatile semiconductor storage device according to a fourth embodiment.

Referring now to FIG. 23, a specific configuration of a non-volatile semiconductor storage device according to a fourth embodiment of the present invention will be described below. Note that the same reference numerals represent the same components as the first embodiment and description thereof will be omitted in the fourth embodiment.

As illustrated in FIG. 23, the non-volatile semiconductor storage device according to the fourth embodiment has a source-side selection transistor layer 20a, a memory transistor layer 30c, and a drain-side selection transistor layer 40a, each different from the first to third embodiments.

The source-side selection transistor layer 20a has source-side second insulation layers 23a, source-side-hole first insulation layers 29c, and source-side-hole second insulation layers 29d, each different from the first embodiment.

Unlike the first embodiment, the source-side second insulation layers 23a are formed by silicon nitride (SiN).

The upper portions of the source-side-hole first insulation layers 29c are formed, unlike the first embodiment, to be lower than the respective top surfaces of the source-side columnar semiconductor layers 28 and the source-side second insulation layers 23a. Similarly, the upper portions of the source-side-hole second insulation layers 29d are formed, unlike the first embodiment, to be lower than the respective top surfaces of the source-side columnar semiconductor layers 28 and the source-side second insulation layers 23a, and to be on the same level with the upper portions of the source-side-hole first insulation layers 29c. Note that the source-side-hole first insulation layers 29c and the source-side-hole second insulation layers 29d are formed to have a length between their top surfaces and the surfaces of the source-side second insulation layers 23a which is not less than two thirds (⅔) the aperture diameter of the source-side holes 26.

In addition to the configuration of the first embodiment, the memory transistor layer 30c has memory protection insulation layers 39. The memory transistor layer 30c also has memory columnar semiconductor layers 37a, memory-hole first insulation layers 38c, and memory-hole second insulation layers 38d, each different from the first to third embodiments.

The memory protection insulation layers 39 are formed on the top surfaces of the fifth insulation layer between word lines 31e. The memory protection insulation layers 39 are formed by silicon nitride (SiN). Note that the memory protection insulation layers 39 have memory holes 35 formed therein.

Similar to the first embodiment, each of the memory columnar semiconductor layers 37a extends in a direction perpendicular to the semiconductor substrate Ba and has a hollow extending downward from its upper end. In addition, the memory columnar semiconductor layers 37a are formed in contact with the respective top surfaces of the source-side-hole first insulation layers 29c and the source-side-hole second insulation layers 29d. That is, the memory columnar semiconductor layers 37a are formed to extend from the memory holes 35 to the source-side holes 26. In addition, the outer walls of the memory columnar semiconductor layers 37a are formed in contact with the inner walls of the source-side columnar semiconductor layers 28. The memory columnar semiconductor layers 37a come in contact with the source-side columnar semiconductor layers 28, across a length (depth) of not less than two thirds (⅔) the aperture diameter of the source-side holes 26.

The upper portions of the memory-hole first insulation layers 38c are formed, unlike the first embodiment, to be lower than the respective top surfaces of the memory columnar semiconductor layers 37a and the memory protection insulation layers 39. Similarly, the upper portions of the memory-hole second insulation layers 38d are formed, unlike the first embodiment, to be lower than the respective top surfaces of the memory columnar semiconductor layers 37a and the memory protection insulation layers 39, and to be on the same level with the memory-hole first insulation layers 38c. Note that the memory-hole first insulation layers 38c and the memory-hole second insulation layers 38d are formed to have a length between their top surfaces and the surfaces of the memory protection insulation layers 39 which is not less than two thirds (⅔) the aperture diameter of the memory holes 35.

The drain-side selection transistor layer 40a has drain-side second insulation layers 43a, drain-side columnar semiconductor layers 48a, drain-side-hole first insulation layers 49c, and drain-side-hole second insulation layers 49d, each different from the first embodiment.

Unlike the first embodiment, the drain-side second insulation layers 43a are formed by silicon nitride (SiN).

Similar to the first embodiment, each of the drain-side columnar semiconductor layers 48a extends in a direction perpendicular to the semiconductor substrate Ba and has a hollow extending downward from its upper end. In addition, the drain-side columnar semiconductor layers 48a are formed in contact with the respective top surfaces of the memory-hole first insulation layers 38c and the memory-hole second insulation layers 38d. That is, the drain-side columnar semiconductor layers 48a are formed to extend from the drain-side holes 46 to the memory holes 35. In addition, the outer walls of the drain-side columnar semiconductor layers 48a are formed in contact with the inner walls of the memory columnar semiconductor layers 37a. The drain-side columnar semiconductor layers 48a come in contact with the memory columnar semiconductor layers 37a, across a length (depth) of not less than two thirds (⅔) the aperture diameter of the memory holes 35.

The drain-side-hole first insulation layers 49c are formed to extend from the drain-side holes 46 to the memory holes 35, as in the drain-side columnar semiconductor layers 48a.

The drain-side-hole second insulation layers 49d are formed to extend from the drain-side holes 46 to the memory holes 35, as in the drain-side-hole first insulation layers 49c. In addition, the upper portions of the drain-side-hole second insulation layers 49d are formed to be lower than the respective top surfaces of the drain-side-hole first insulation layers 49c and the drain-side second insulation layers 43a.

In addition, a barrier metal layer 55a and a wiring conductive layer 56a are formed on the drain-side selection transistor layer 40a. The barrier metal layer 55a is formed in the wiring trench 54. In addition, the barrier metal layer 55a is formed in contact with the side surfaces of the drain-side-hole first insulation layers 49c and the top surfaces of the drain-side-hole second insulation layers 49d. The wiring conductive layer 56a is formed in contact with the barrier metal layer 55a. The barrier metal layer 55a is formed by titanium nitride (TiN). The wiring conductive layer 56a is formed by tungsten (W). That is, unlike the first to third embodiments, the barrier metal layer 55a and the wiring conductive layer 56a have such shapes that protrude downward from the wiring trench 54 at positions where the drain-side-hole first insulation layers 49c are formed.

(Manufacturing Process of Non-Volatile Semiconductor Storage Device in Fourth Embodiment)

Referring now to FIGS. 24 through 47, a manufacturing process of the non-volatile semiconductor storage device according to the fourth embodiment will be described below.

Figure 24:
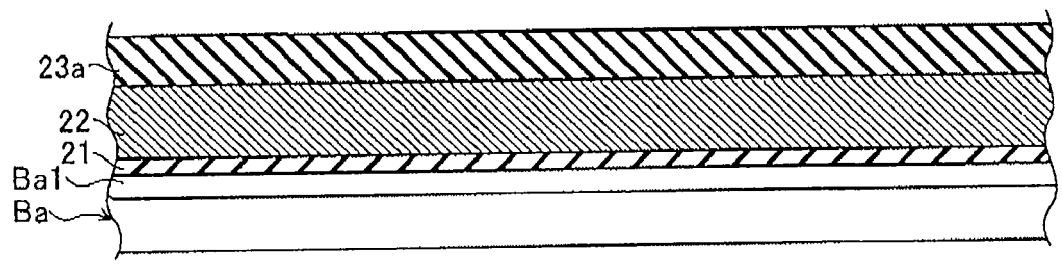
FIG. 24 is a cross-sectional view of the non-volatile semiconductor storage device in a manufacturing process according to the fourth embodiment.

Firstly, as illustrated in FIG. 24, a P-well area Ba1 is formed on the semiconductor substrate Ba, and then silicon oxide (20 nm), polysilicon (100 nm), and silicon oxide (100 nm) are sequentially laminated thereon to form a source-side first insulation layer 21, a source-side conductive layer 22, and a source-side second insulation layer 23a, respectively.

Figure 25:
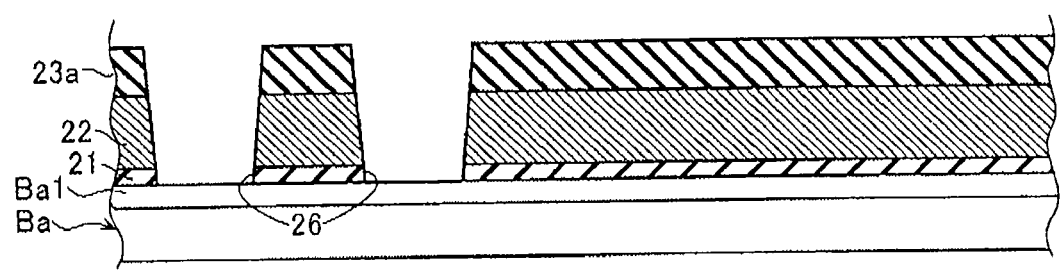
FIG. 25 is a cross-sectional view of the non-volatile semiconductor storage device in the manufacturing process according to the fourth embodiment.

Then, as illustrated in FIG. 25, source-side holes 26 are formed on the P-well area Ba1 at a predetermined pitch so as to penetrate the source-side second insulation layer 23a, the source-side conductive layer 22, and the source-side first insulation layer 21, respectively. In this case, each of the source-side holes 26 has an aperture diameter of, e.g., 50 nm.

Figure 26:
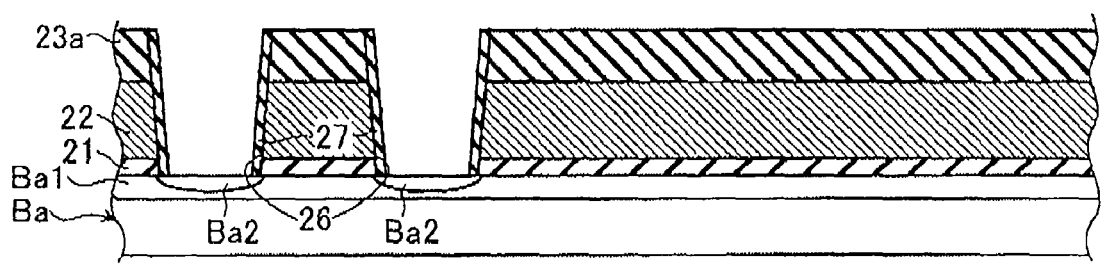
FIG. 26 is a cross-sectional view of the non-volatile semiconductor storage device in the manufacturing process according to the fourth embodiment.

Then, as illustrated in FIG. 26, for example, arsenic (As) ion is injected onto the bottom surfaces of the source-side holes 26 (the P-well area Ba1) to form n$^+$ areas Ba2 on the P-well area Ba1. Thereafter, silicon oxide ($SiO_2$) is deposited within the source-side holes 26 and any silicon oxide ($SiO_2$) is removed by Reactive Ion Etching (RIE) that is formed on the bottom portions of the source-side holes 26, thereby forming source-side gate insulation layers 27. In addition, hydrofluoric acid treatment is performed to remove any natural oxide film on the bottom portions of the source-side holes 26.

Figure 27:
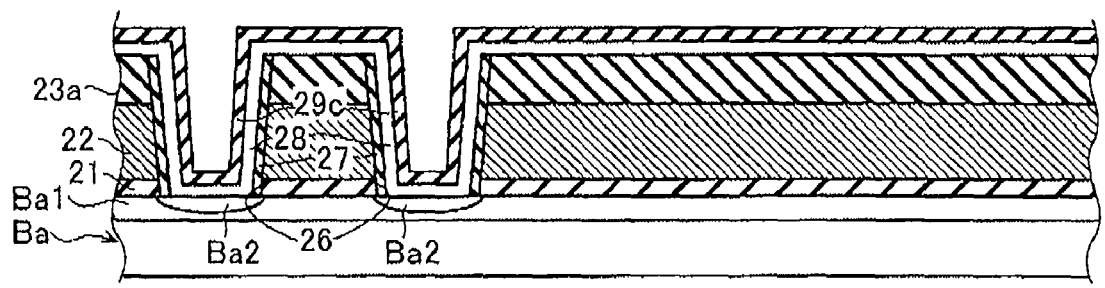
FIG. 27 is a cross-sectional view of the non-volatile semiconductor storage device in the manufacturing process according to the fourth embodiment.

Then, as illustrated in FIG. 27, an amorphous silicon layer is deposited thereon (e.g., 10 nm). In this case, amorphous silicon is deposited within the source-side holes 26 so that hollows are left with a diameter of on the order of 20 nm. Then, the surface of the amorphous silicon layer is oxidized by low-temperature plasma at a temperature of not more than 500 degrees C., and a silicon oxide film is grown on the surface of the amorphous silicon layer (on the order of 7 nm) to form a source-side-hole first insulation layer 29c. In this case, the amorphous silicon layer is consumed on the order of 3 nm. Further, the inner portion of the amorphous silicon layer that is left without oxidization is polycrystallized in a nitride atmosphere at 600 degrees C. to provide polysilicon (p-Si). As a result, a source-side columnar semiconductor layer 28 is formed. Then, it is desirable to perform heat treatment in an oxidizing atmosphere at on the order of 800 degrees C.

Figure 28:
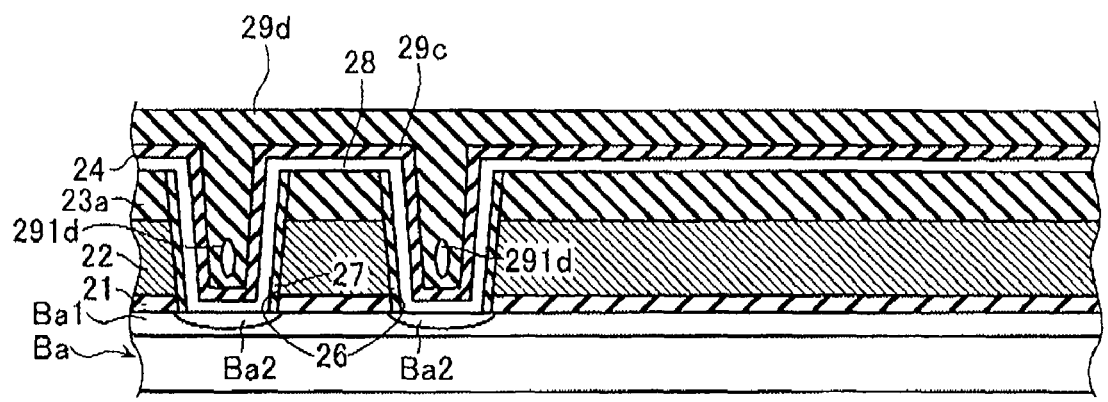
FIG. 28 is a cross-sectional view of the non-volatile semiconductor storage device in the manufacturing process according to the fourth embodiment.

Then, as illustrated in FIG. 28, silicon nitride (SiN) is deposited on the source-side-hole first insulation layer 29c to fill up the hollows thereon, thereby forming a source-side-hole second insulation layer 29d. In this case, voids 291d are formed in the source-side-hole second insulation layer 29d.

Figure 29:
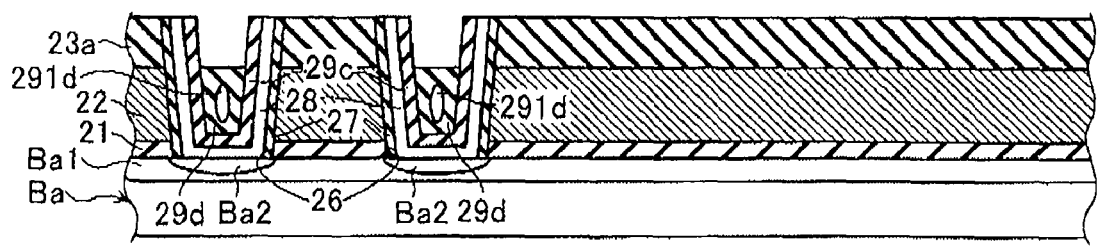
FIG. 29 is a cross-sectional view of the non-volatile semiconductor storage device in the manufacturing process according to the fourth embodiment.

Then, as illustrated in FIG. 29, those portions of the source-side-hole second insulation layer 29d, the source-side-hole first insulation layer 29c, and the source-side columnar semiconductor layer 28 are removed by RIE that are formed on the source-side second insulation layers 23a. In addition, the source-side-hole second insulation layers 29d are further removed by etching to a predetermined depth from the respective top surfaces of the source-side-hole first insulation layers 29c and the source-side columnar semiconductor layers 28.

Figure 30:
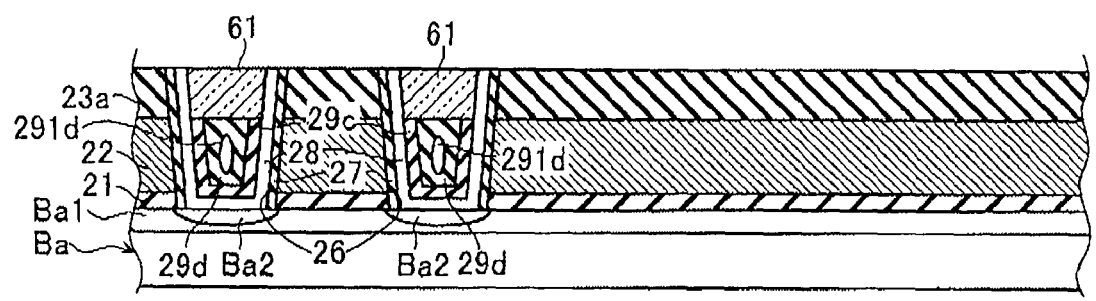
FIG. 30 is a cross-sectional view of the non-volatile semiconductor storage device in the manufacturing process according to the fourth embodiment.

Then, as illustrated in FIG. 30, those portions of the source-side-hole first insulation layers 29c are removed by, e.g., hydrofluoric acid treatment that are exposed on the top surfaces of the source-side-hole second insulation layers 29d. Then, PSG (Phosphorous doped silicate glass) is deposited thereon to form PSG layers 61.

Figure 31:
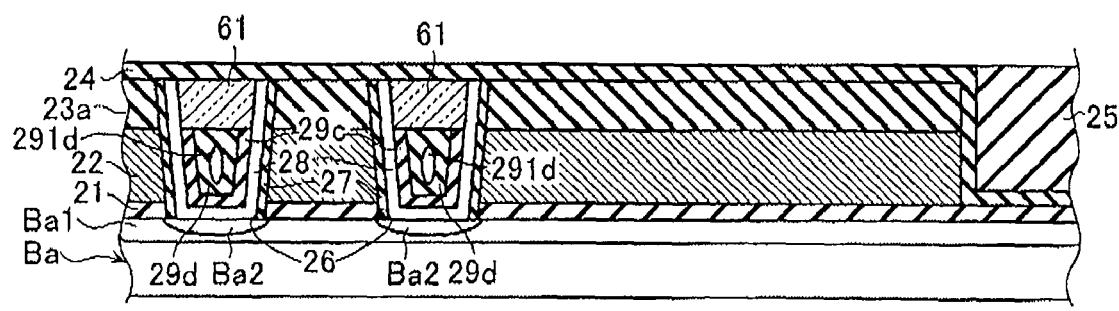
FIG. 31 is a cross-sectional view of the non-volatile semiconductor storage device in the manufacturing process according to the fourth embodiment.

Then, as illustrated in FIG. 31, those portions of the source-side first insulation layers 21, the source-side conductive layers 22, and the source-side second insulation layers 23a are removed that are formed in areas in the row and column directions spaced a predetermined distance respectively from the center of the memory transistor area 12. Subsequently, silicon nitride (SiN) and silicon oxide (SiO$_2$) are laminated thereon and then its upper portion is flattened by Chemical Mechanical Polishing (CMP). As a result, a source-side isolation/insulation layer 24 and an interlayer insulation layer 25 are formed.

Figure 32:
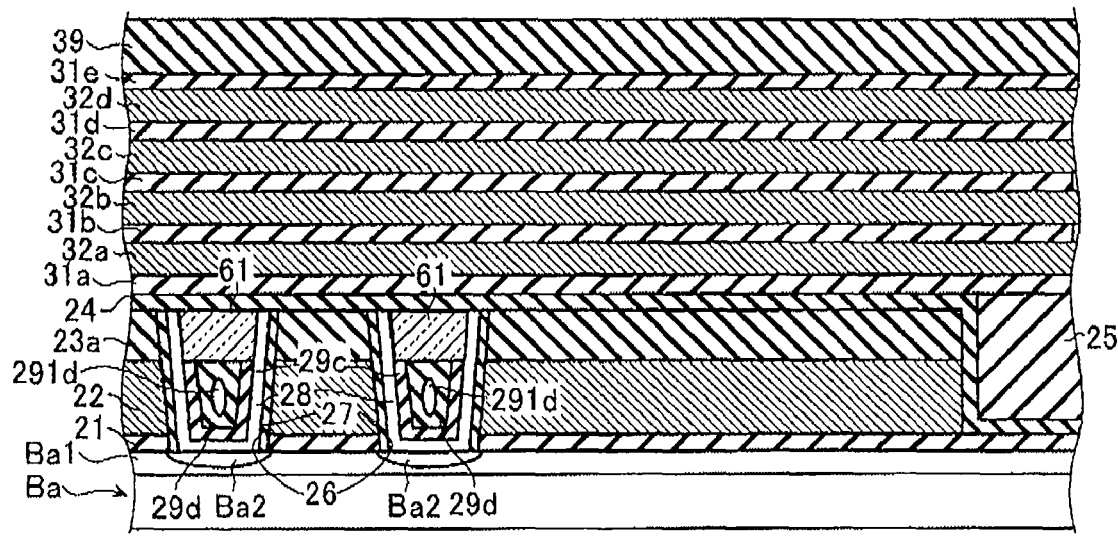
FIG. 32 is a cross-sectional view of the non-volatile semiconductor storage device in the manufacturing process according to the fourth embodiment.

Then, as illustrated in FIG. 32, silicon oxide (SiO$_2$) and amorphous silicon (a-Si) are alternately laminated on the source-side isolation/insulation layer 24 and the interlayer insulation layer 25 and then silicon nitride (SiN) is deposited thereon to form first to fifth insulation layers between word lines 31a to 31e, first to fourth word-line conductive layers 32a to 32d, and a memory protection insulation layer 39.

Figure 33:
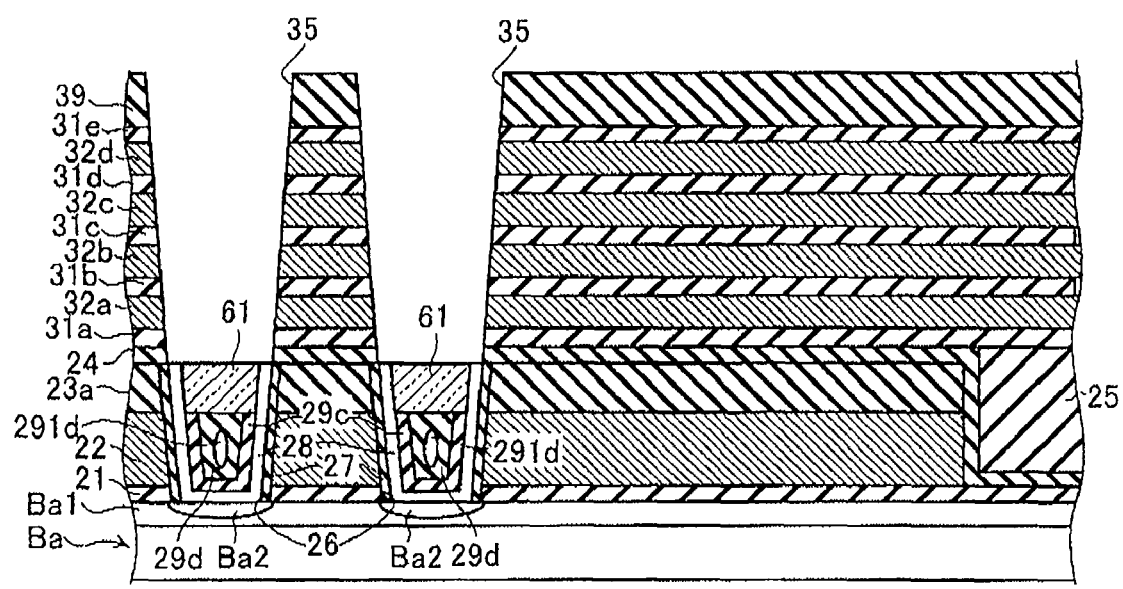
FIG. 33 is a cross-sectional view of the non-volatile semiconductor storage device in the manufacturing process according to the fourth embodiment.

Then, as illustrated in FIG. 33, memory holes 35 are formed at positions matching the source-side holes 26 so as to penetrate the memory protection insulation layer 39, the first to fifth insulation layers between word lines 31a to 31e, the first to fourth word-line conductive layers 32a to 32d, and the source-side isolation/insulation layer 24.

Figure 34:
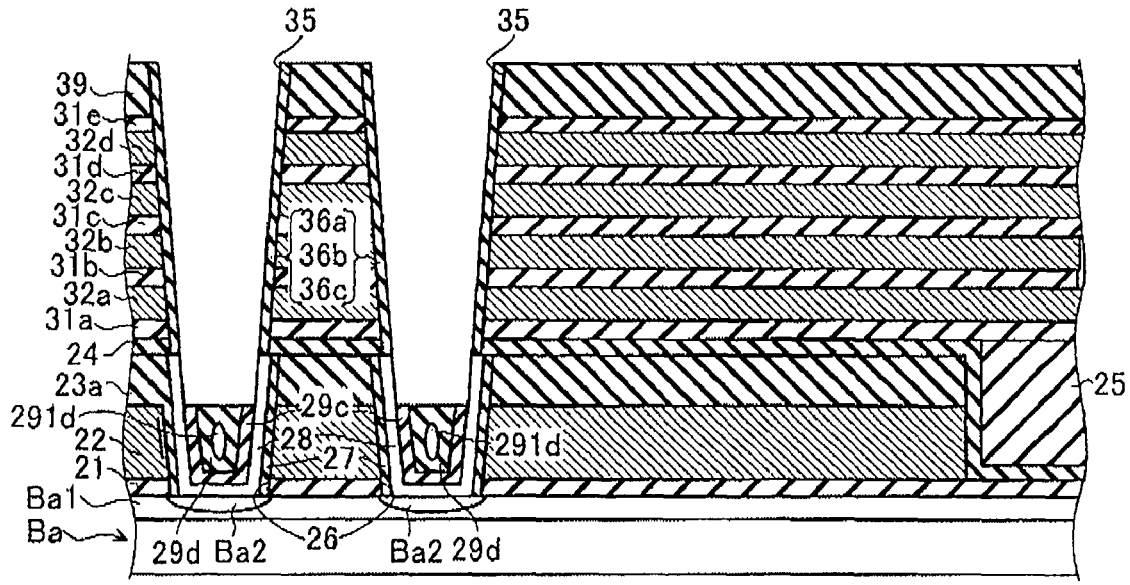
FIG. 34 is a cross-sectional view of the non-volatile semiconductor storage device in the manufacturing process according to the fourth embodiment.

Then, as illustrated in FIG. 34, silicon oxide (SiO$_2$), silicon nitride (SiN), and silicon oxide (SiO$_2$) are deposited within the memory holes 35. Then, silicon oxide (SiO$_2$), silicon nitride (SiN), and silicon oxide (SiO$_2$) are removed by RIE that are formed on the upper portions of the memory protection insulation layers 39 and the bottom portions of the memory holes 35. As a result, block insulation layers 36a, charge accumulation layers 36b, and tunnel insulation layers 36c are formed. At this moment, the PSG layers 61 formed on the bottom portions of the memory holes 35 are also removed.

Figure 35:
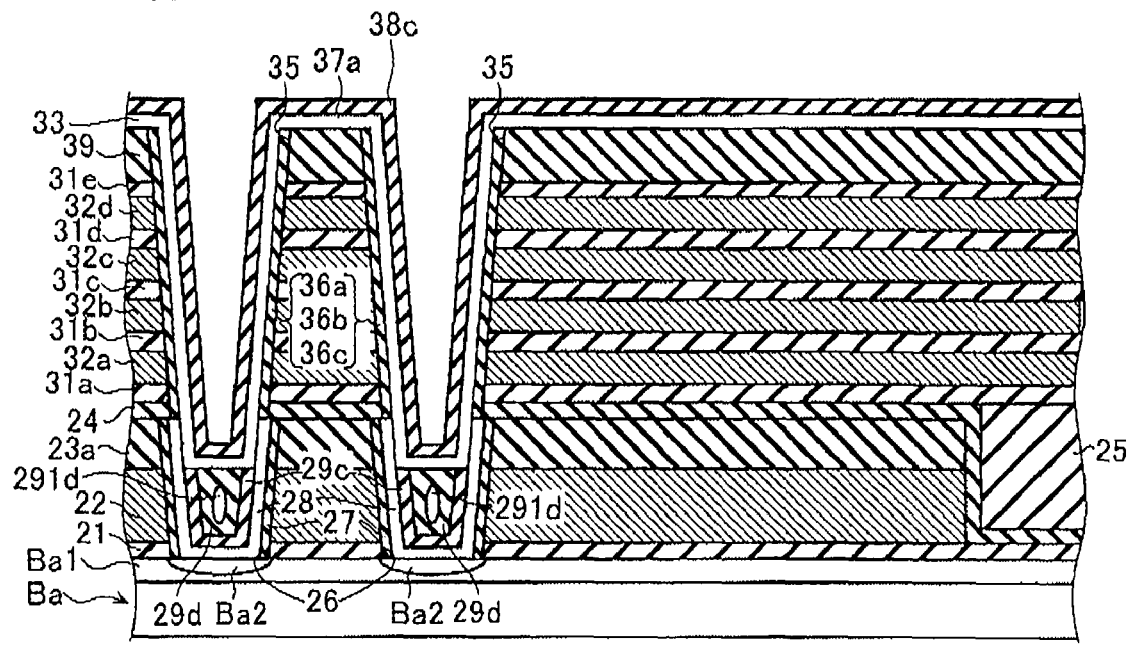
FIG. 35 is a cross-sectional view of the non-volatile semiconductor storage device in the manufacturing process according to the fourth embodiment.

Then, as illustrated in FIG. 35, amorphous silicon (a-Si) is deposited on the respective surfaces of the tunnel insulation layers 36c, the source-side columnar semiconductor layers 28, the source-side-hole first insulation layers 29c, and the source-side-hole second insulation layers 29d. Thereafter, the surface of amorphous silicon is oxidized by plasma to form a memory-hole first insulation layer 38c. In addition, the inner portion of the amorphous silicon that is left without oxidization is polycrystallized to provide polysilicon, by which a memory columnar semiconductor layer 37a is formed.

Figure 36:
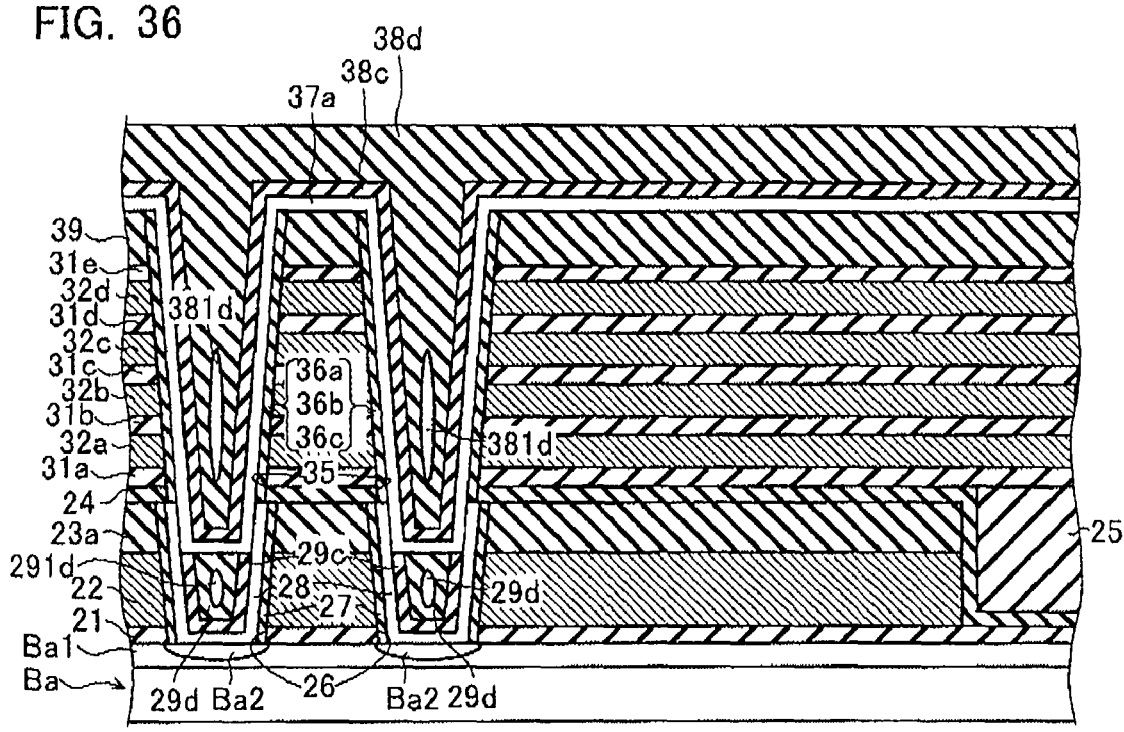
FIG. 36 is a cross-sectional view of the non-volatile semiconductor storage device in the manufacturing process according to the fourth embodiment.

Then, as illustrated in FIG. 36, silicon nitride (SiN) is deposited on the memory-hole first insulation layer 38c to fill up the hollows thereon, thereby forming a memory-hole second insulation layer 38d. In this case, voids 381d are formed in the memory-hole second insulation layer 38d.

Figure 37:
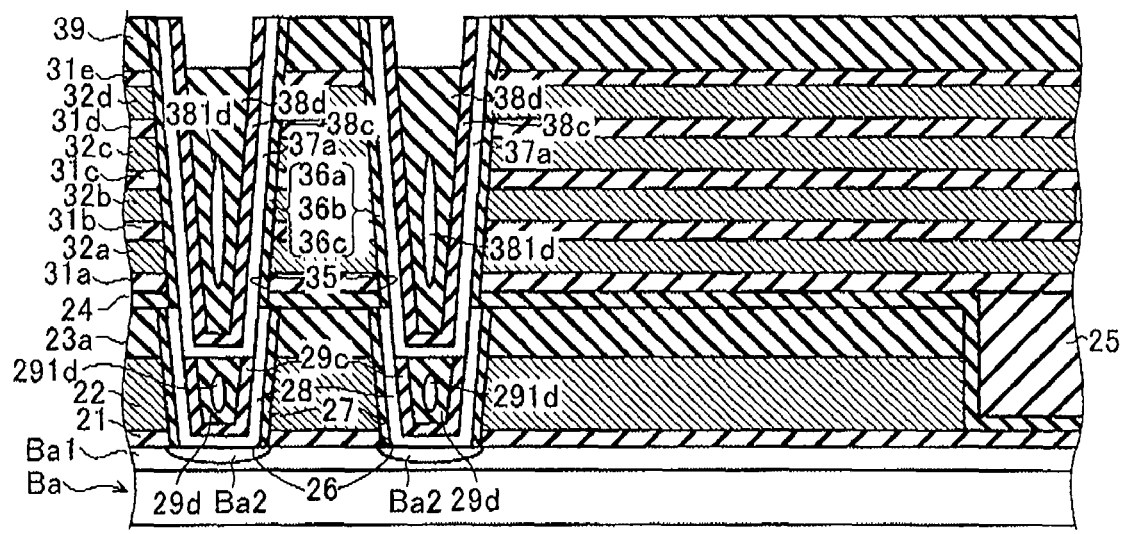
FIG. 37 is a cross-sectional view of the non-volatile semiconductor storage device in the manufacturing process according to the fourth embodiment.

Then, as illustrated in FIG. 37, those portions of the memory-hole second insulation layer 38d, the memory-hole first insulation layer 38c, and the memory columnar semiconductor layer 37a are removed by RIE that are formed on the memory protection insulation layers 39. Further, the memory-hole second insulation layers 38d are removed by etching to a predetermined depth, respectively.

Figure 38:
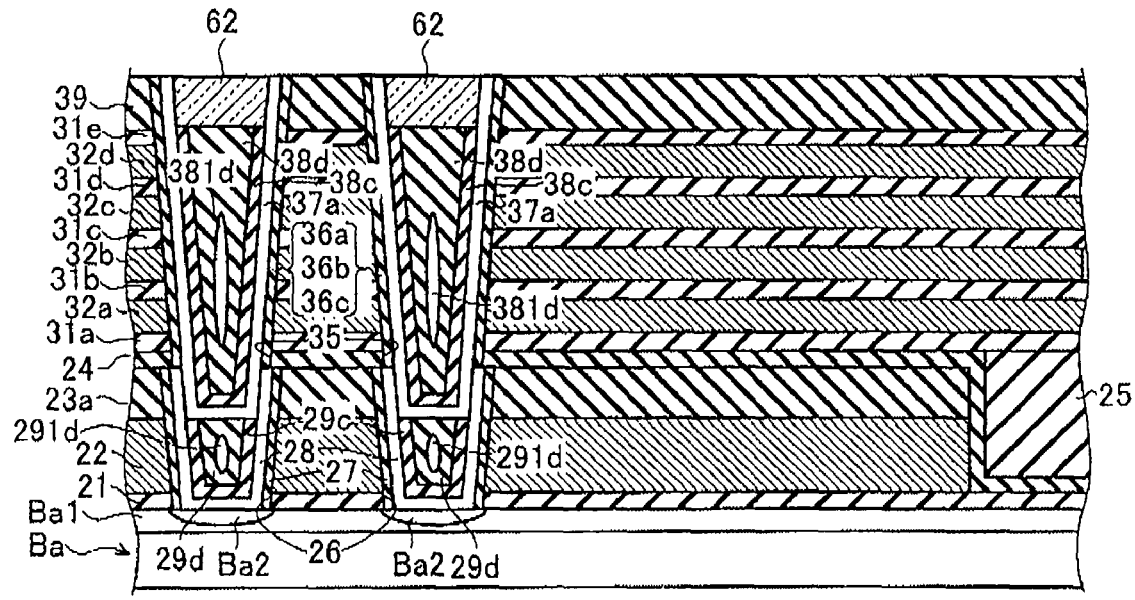
FIG. 38 is a cross-sectional view of the non-volatile semiconductor storage device in the manufacturing process according to the fourth embodiment.

Then, as illustrated in FIG. 38, those portions of the memory-hole first insulation layers 38c are removed by, e.g., hydrofluoric acid treatment that are exposed on the top surfaces of the memory-hole second insulation layers 38d. Then, PSG is deposited thereon to form PSG layers 62.

Figure 39:
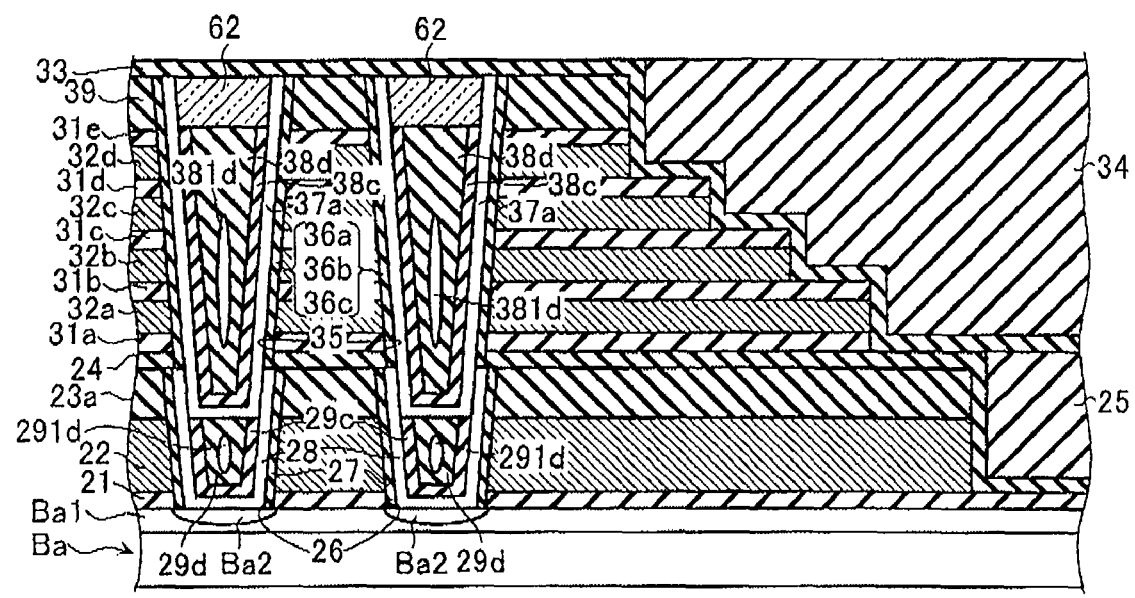
FIG. 39 is a cross-sectional view of the non-volatile semiconductor storage device in the manufacturing process according to the fourth embodiment.

Then, as illustrated in FIG. 39, those portions of the first to fifth insulation layers between word lines 31a to 31e, the first to fourth word-line conductive layers 32a to 32d, and the memory protection insulation layers 39 are processed in a stepwise manner in relation to each other that are formed in areas in the row and column directions spaced a predetermined distance respectively from the center of the memory transistor area 12. Subsequently, silicon nitride (SiN) and silicon oxide (SiO$_2$) are laminated thereon and then its upper portion is flattened by Chemical Mechanical Polishing (CMP). As a result, a memory isolation/insulation layer 33 and an interlayer insulation layer 34 are formed.

Figure 40:
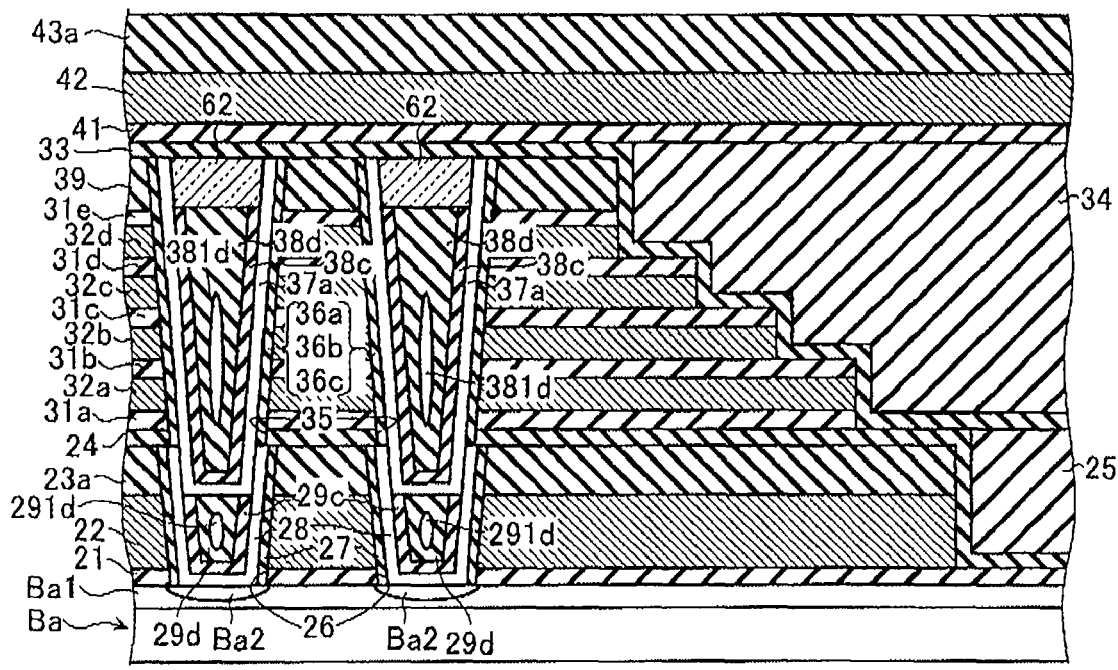
FIG. 40 is a cross-sectional view of the non-volatile semiconductor storage device in the manufacturing process according to the fourth embodiment.

Then, as illustrated in FIG. 40, silicon oxide (SiO$_2$), polysilicon (p-Si), and silicon nitride (SiN) are sequentially laminated on the memory isolation/insulation layer 33 and the interlayer insulation layer 34 to form a drain-side first insulation layer 41, a drain-side conductive layer 42, and a drain-side second insulation layer 43a.

Figure 41:
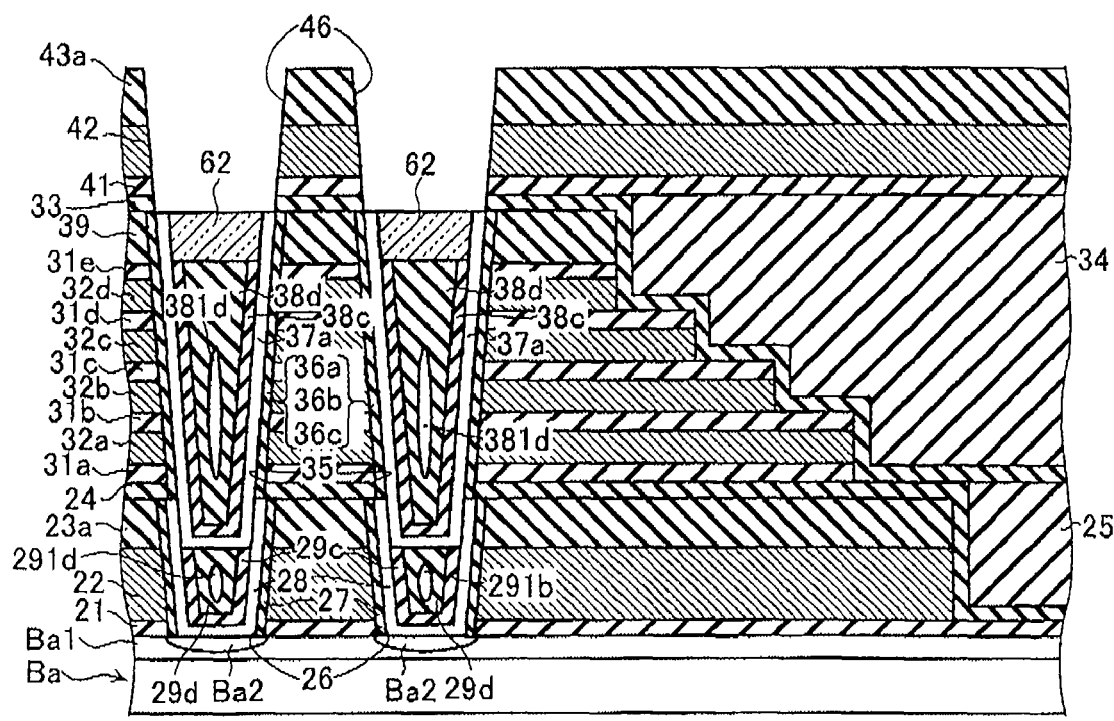
FIG. 41 is a cross-sectional view of the non-volatile semiconductor storage device in the manufacturing process according to the fourth embodiment.

Then, as illustrated in FIG. 41, drain-side holes 46 are formed at positions matching the memory holes 35 so as to penetrate the drain-side first insulation layer 41, the drain-side conductive layer 42, and the drain-side second insulation layer 43a.

Figure 42:
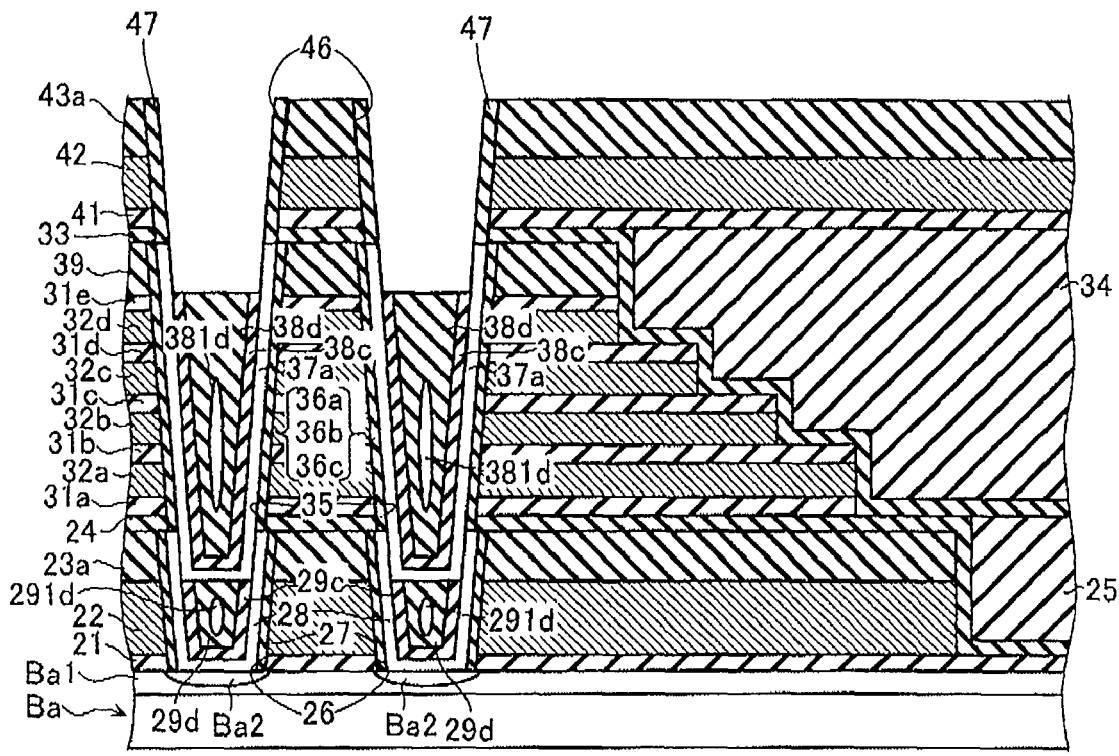
FIG. 42 is a cross-sectional view of the non-volatile semiconductor storage device in the manufacturing process according to the fourth embodiment.

Then, as illustrated in FIG. 42, silicon oxide (SiO$_2$) is deposited within the drain-side holes 46 and any silicon oxide (SiO$_2$) is removed by RIE that is formed on the upper portions of the drain-side second insulation layers 43a and the bottom portions of the drain-side holes 46, thereby forming drain-side gate insulation layers 47. At this moment, the PSG layers 62 formed on the bottom portions of the drain-side holes 46 are also removed.

Figure 43:
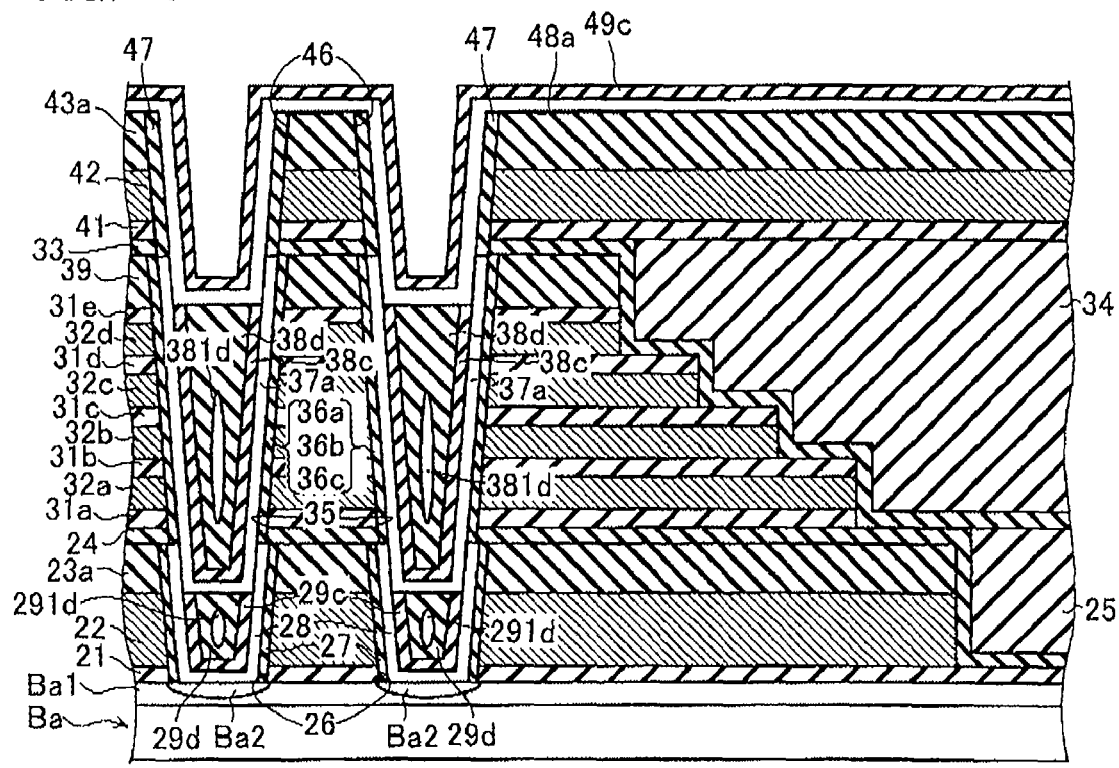
FIG. 43 is a cross-sectional view of the non-volatile semiconductor storage device in the manufacturing process according to the fourth embodiment.

Then, as illustrated in FIG. 43, amorphous silicon (a-Si) is deposited on the respective surfaces of the drain-side gate insulation layers 47, the memory columnar semiconductor layers 37a, the memory-hole first insulation layers 38c, and the memory-hole second insulation layers 38d. Subsequently, the surface of amorphous silicon is oxidized by plasma to form a drain-side-hole first insulation layer 49c. In addition, the inner portion of the amorphous silicon that is left without oxidization is polycrystallized to provide polysilicon, by which a drain-side columnar semiconductor layer 48a is formed.

Figure 44:
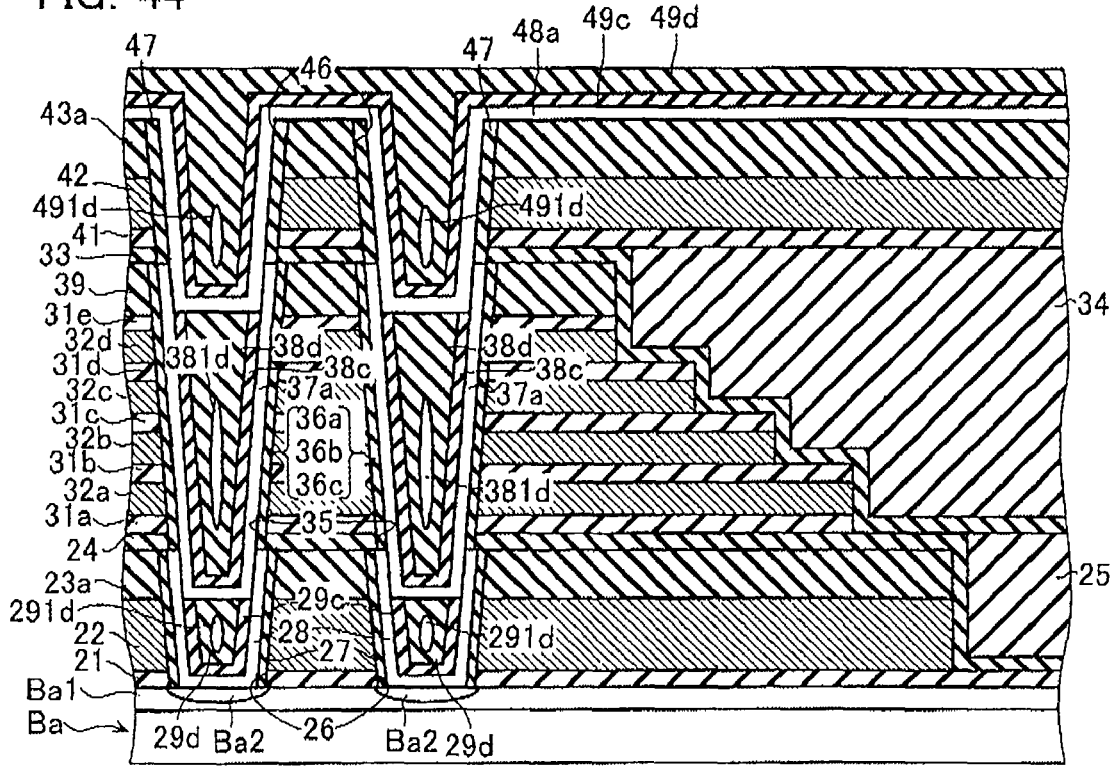
FIG. 44 is a cross-sectional view of the non-volatile semiconductor storage device in the manufacturing process according to the fourth embodiment.

Then, as illustrated in FIG. 44, silicon nitride (SiN) is deposited on the drain-side-hole first insulation layer 49c to fill up the hollows thereon, thereby forming a drain-side-hole second insulation layer 49d. In this case, voids 491d are formed in the drain-side-hole second insulation layer 49d.

Figure 45:
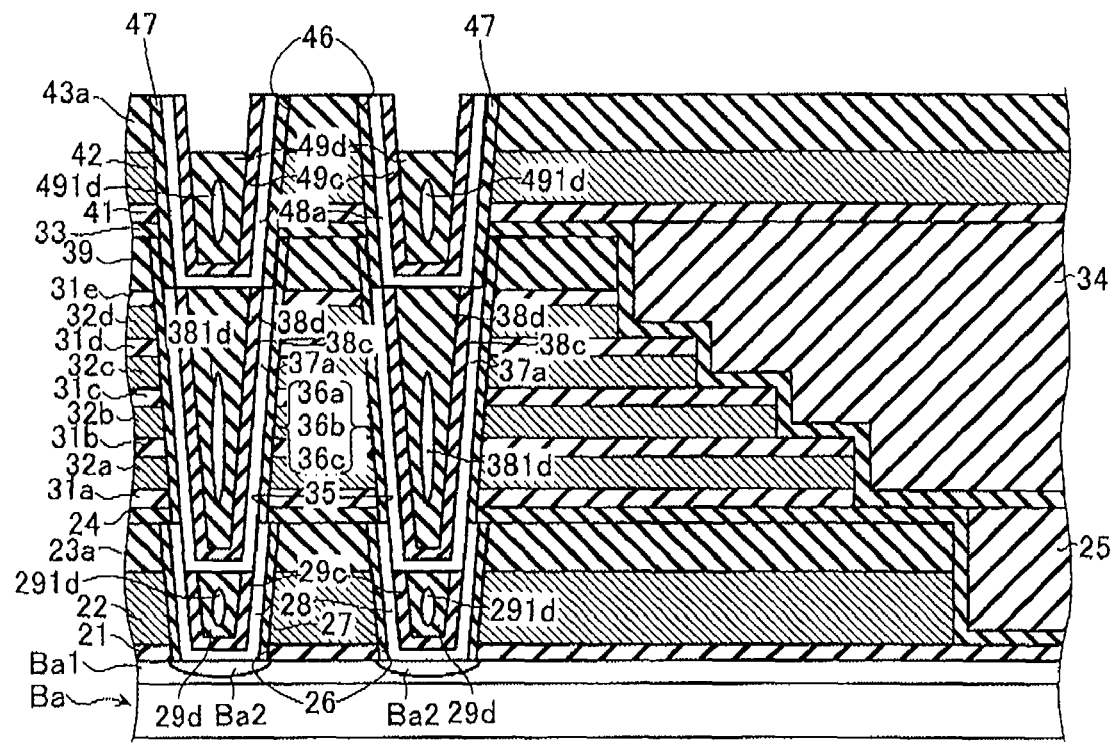
FIG. 45 is a cross-sectional view of the non-volatile semiconductor storage device in the manufacturing process according to the fourth embodiment.

Then, as illustrated in FIG. 45, those portions of the drain-side-hole second insulation layer 49d, the drain-side-hole first insulation layer 49c, and the drain-side columnar semiconductor layer 48a are removed by RIE that are formed on the drain-side second insulation layers 43a. Further, the drain-side-hole second insulation layers 49d are removed by etching to a predetermined depth, respectively.

Figure 46:
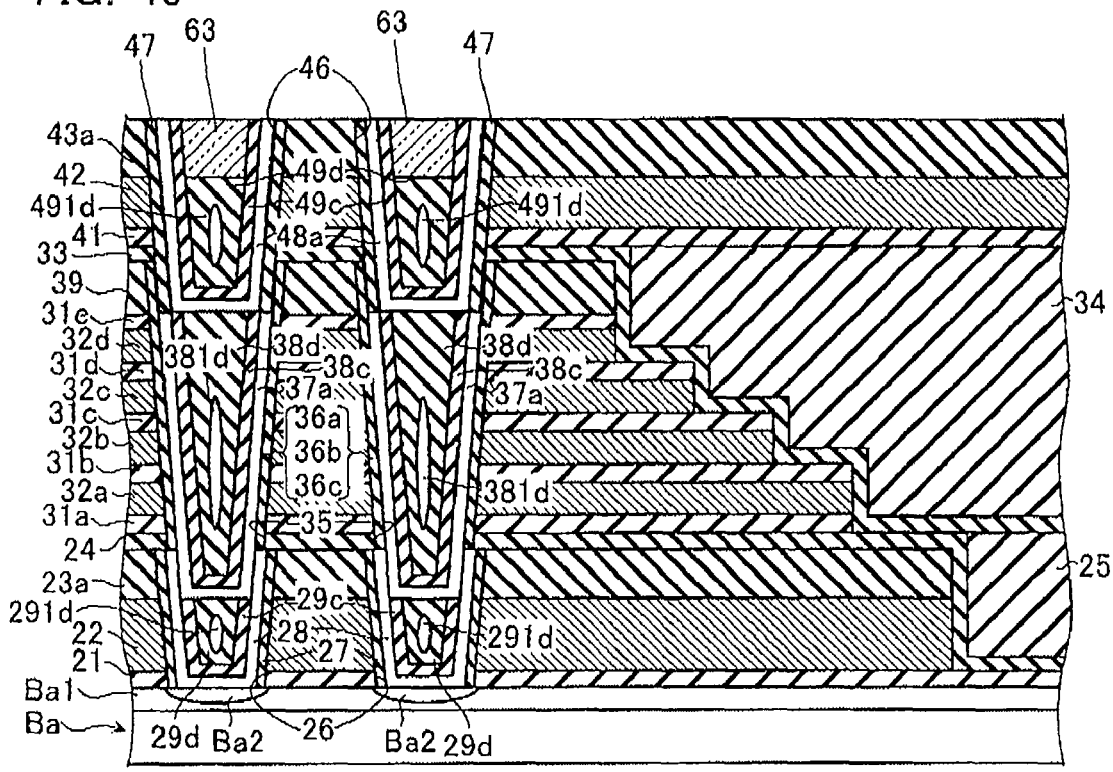
FIG. 46 is a cross-sectional view of the non-volatile semiconductor storage device in the manufacturing process according to the fourth embodiment.

Then, as illustrated in FIG. 46, PSG is deposited on the top surfaces of the drain-side-hole second insulation layers 49d to form PSG layers 63.

Figure 47:
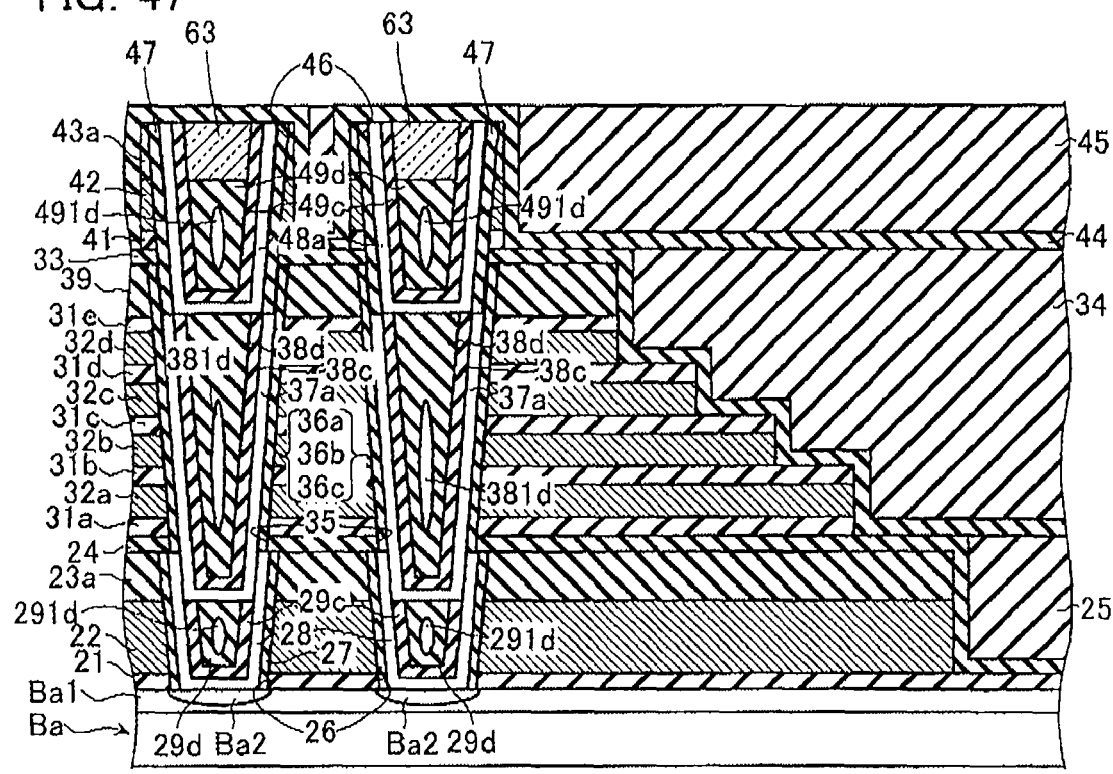
FIG. 47 is a cross-sectional view of the non-volatile semiconductor storage device in the manufacturing process according to the fourth embodiment.

Then, as illustrated in FIG. 47, the drain-side first insulation layers 41, the drain-side conductive layers 42, and the drain-side second insulation layers 43a are positioned at a predetermined pitch in the row direction and processed in a stripe form in the column direction. Thereafter, silicon nitride (SiN) and silicon oxide ($SiO_2$) are deposited and CMP process is performed thereon, by which a drain-side isolation/insulation layer 44 and an interlayer insulation layer 45 are formed. Further, plug holes 51 and a wiring trench 54 are formed as in the first embodiment. Then, the PSG layers 63 located below the wiring trench 54 are removed and the same process as the first embodiment is performed to manufacture the non-volatile semiconductor storage device according to the fourth embodiment as illustrated in FIG. 23. Note that a barrier metal layer 55a and a wiring conductive layer 56a are formed in the space where the wiring trench 54 and the PSG layers 63 were previously formed.

(Advantages of Non-Volatile Semiconductor Storage Device in Fourth Embodiment)

Advantages of the non-volatile semiconductor storage device according to the fourth embodiment will now be described below. The non-volatile semiconductor storage device according to the fourth embodiment has the same advantages as the first embodiment. In addition, in the non-volatile semiconductor storage device according to the fourth embodiment, the surfaces (outer walls) of the memory columnar semiconductor layers 37a are formed in contact with the surfaces (inner walls) facing the hollows in the source-side columnar semiconductor layers 28. In addition, in the non-volatile semiconductor storage device according to the fourth embodiment, the surfaces (outer walls) of the drain-side columnar semiconductor layers 48a are formed in contact with the surfaces (inner walls) facing the hollows in the memory columnar semiconductor layers 37a.

Accordingly, the source-side columnar semiconductor layers 28, the memory columnar semiconductor layers 37a, and the drain-side columnar semiconductor layers 48a according to the fourth embodiment may have larger contact areas therebetween, as compared with the first to third embodiments. That is, the non-volatile semiconductor storage device according to the fourth embodiment may reduce the contact resistance between the source-side columnar semiconductor layers 28, the memory columnar semiconductor layers 37a, and the drain-side columnar semiconductor layers 48a, as compared with the first to third embodiments.

Figure 48:
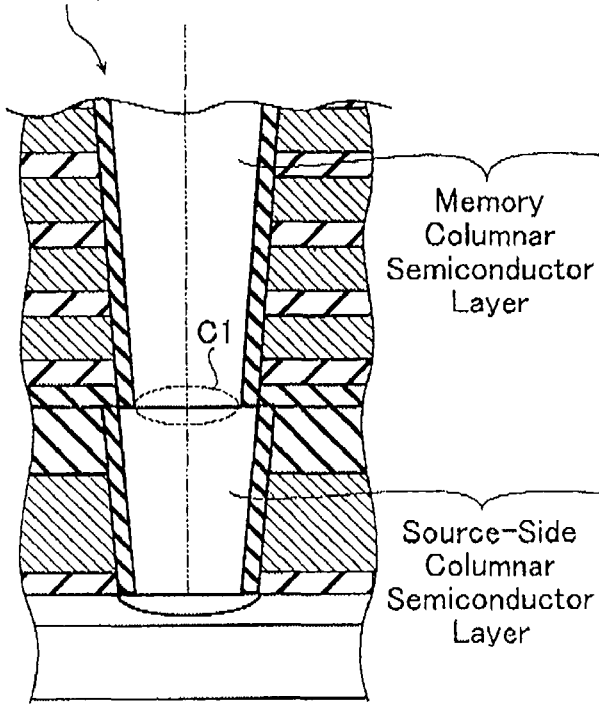
FIG. 48 illustrates advantages of the non-volatile semiconductor storage device according to the fourth embodiment.
Figure 48:
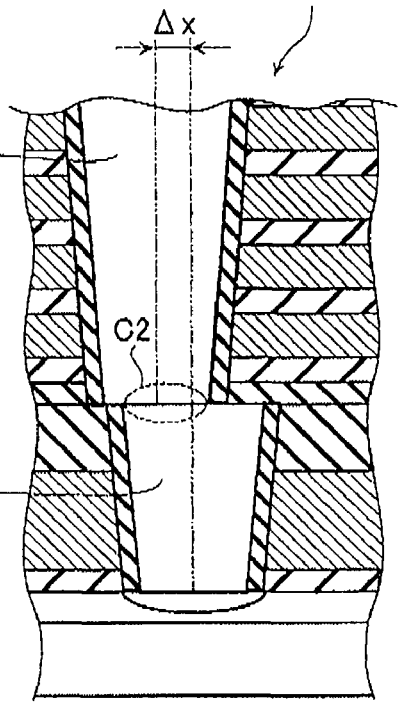
Figure 48:
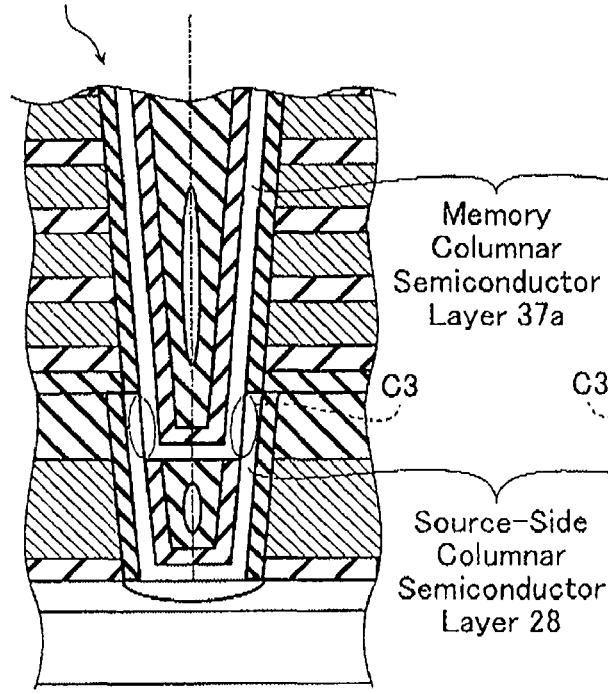
Figure 48:
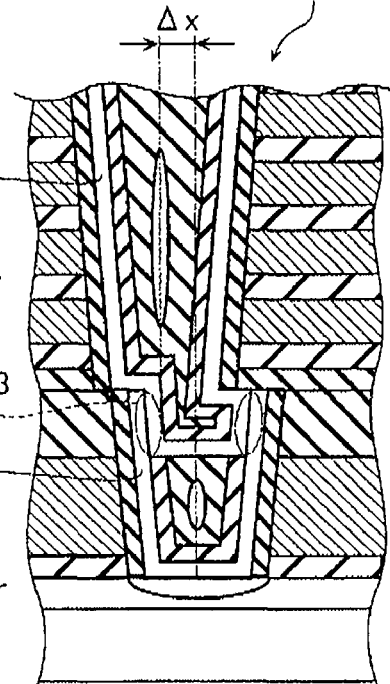

Referring now to FIG. 48, advantages of the non-volatile semiconductor storage device according to the fourth embodiment will be described below. FIG. 48 illustrates the fourth embodiment and a comparative example where the source-side columnar semiconductor layers and the memory columnar semiconductor layers are formed in a columnar shape without any hollows. FIG. 48 illustrates respective cases of "without deviation of alignment" and "with deviation of alignment". In FIG. 48, "without deviation of alignment" represents where the central axis of the source-side columnar semiconductor layer is aligned with the central axis of the memory columnar semiconductor layer, while "with deviation of alignment" represents where the central axis of the source-side columnar semiconductor layer deviates from the central axis of the memory columnar semiconductor layer by Δx. In addition, in FIG. 48, the area over which the source-side columnar semiconductor layer comes in contact with the memory columnar semiconductor layer is referred to as a "contact area".

In the comparative example, a contact area C2 for "with deviation of alignment" indicated by label "b" of FIG. 48 is smaller than a contact area C1 for "without deviation of alignment" indicated by label "a" of FIG. 48. On the other hand, in the fourth embodiment, a contact area C3 for "with deviation of alignment" indicated by label "d" of FIG. 48 is equal to a contact area C3 for "without deviation of alignment" indicated by label "c" of FIG. 48.

As can be seen from the above, the non-volatile semiconductor storage device according to the fourth embodiment may keep the contact area constant between a lower columnar semiconductor layer and an upper columnar semiconductor layer even if the lower columnar semiconductor layer deviates from the upper columnar semiconductor layer (if any "deviation of alignment" occurs), for example.

Fifth Embodiment (Specific Configuration of Non-Volatile Semiconductor Storage Device in Fifth Embodiment)

Figure 49:
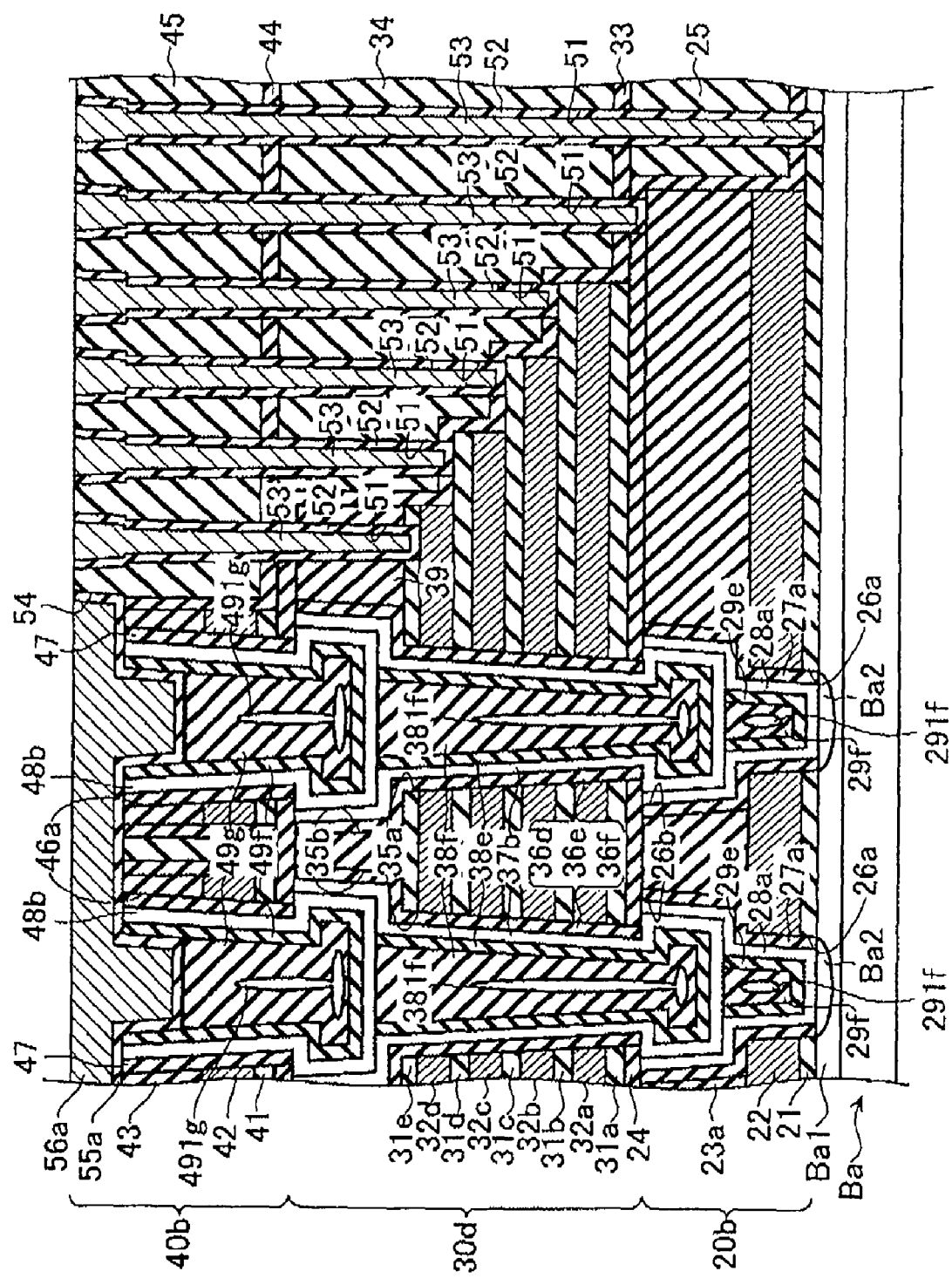
FIG. 49 is a cross-sectional view of a non-volatile semiconductor storage device according to a fifth embodiment.

Referring now to FIG. 49, a specific configuration of a non-volatile semiconductor storage device according to a fifth embodiment of the present invention will be described below. Note that the same reference numerals represent the same components as the first to fourth embodiments and description thereof will be omitted in the fifth embodiment.

As illustrated in FIG. 49, the non-volatile semiconductor storage device according to the fifth embodiment has a source-side selection transistor layer 20b, a memory transistor layer 30d, and a drain-side selection transistor layer 40b, each different from the first to third embodiments.

Unlike the first to fourth embodiments, the source-side selection transistor layer 20b has lower source-side holes 26a and upper source-side holes 26b at positions matching the corresponding $n^+$ areas Ba2. The lower source-side holes 26a are formed from the bottom portions of the upper source-side holes 26b so as to penetrate a source-side conductive layer 22 and a source-side first insulation layer 21. The upper source-side holes 26b are formed to penetrate the source-side second insulation layer 23a. The upper source-side holes 26b are formed with a larger aperture diameter than that of the lower source-side holes 26a.

A source-side gate insulation layer 27a, a source-side columnar semiconductor layer 28a, a source-side-hole first insulation layer 29e, and a source-side-hole second insulation layer 29f are provided in each lower source-side hole 26a and upper source-side hole 26b.

The source-side gate insulation layers 27a are formed in a hollow cylindrical shape so as to come in contact with the respective sidewalls facing the lower source-side holes 26a and the upper source-side holes 26b.

The source-side columnar semiconductor layers 28a are formed in a bottomed cylindrical shape so as to come in contact with the source-side gate insulation layers 27a in the lower source-side holes 26a and the upper source-side holes 26b. In the source-side columnar semiconductor layers 28a, the upper source-side holes 26b are formed with a larger inner diameter than that of the lower source-side holes 26a. In other words, each of the source-side columnar semiconductor layers 28a has a first inner diameter from the bottom end to a first height and a second inner diameter which is larger than the first inner diameter from the first height to the top end.

The source-side-hole first insulation layers 29e are formed in a bottomed cylindrical shape so as to come in contact with the inner walls of the source-side columnar semiconductor layers 28a in the lower source-side holes 26a.

The source-side-hole second insulation layers 29f are formed in a columnar shape so as to come in contact with the source-side-hole first insulation layers 29e in the lower source-side holes 26a. In addition, a void 291f is formed in each of the source-side-hole second insulation layers 29f.

Unlike the first to fourth embodiments, the memory transistor layer 30d has lower memory holes 35a and upper memory holes 35b at positions matching the upper source-side holes 26b. The lower memory holes 35a are formed from the bottom portions of the upper memory holes 35b so as to penetrate the first to fourth word-line conductive layers 32a to 32d and the first to fifth insulation layers between word lines 31a to 31e. The upper memory holes 35b are formed to penetrate the memory isolation/insulation layer 33 and the memory protection insulation layer 39. The upper memory holes 35b are formed with a larger aperture diameter than that of the lower memory holes 35a.

A block insulation layer 36d, a charge accumulation layer 36e, a tunnel insulation layer 36f, a memory columnar semiconductor layer 37b, a memory-hole first insulation layer 38e, and a memory-hole second insulation layer 38f are provided in each upper memory hole 35b, lower memory hole 35a, and upper source-side hole 26b.

The block insulation layers 36d are formed in a hollow cylindrical shape so as to come in contact with the respective sidewalls facing the lower memory holes 35a and the upper memory holes 35b. The charge accumulation layers 36e are formed in a hollow cylindrical shape so as to come in contact with the block insulation layers 36d in the lower and upper memory holes 35a and 35b. The tunnel insulation layers 36f are formed in a hollow cylindrical shape so as to come in contact with the charge accumulation layers 36e in the lower and upper memory holes 35a and 35b.

The memory columnar semiconductor layers 37b are formed in a bottomed cylindrical shape so as to come in contact with the source-side columnar semiconductor layers 28a and the tunnel insulation layers 36f in the upper source-side holes 26b, the lower memory holes 35a, and the upper memory holes 35b. In the memory columnar semiconductor layers 37b, the upper memory holes 35b are formed with a larger inner diameter than that of the lower memory holes 35a. In other words, each of the memory columnar semiconductor layers 37b has a first inner diameter from the bottom end to a second height and a second inner diameter which is larger than the first inner diameter from the second height to the top end.

The memory-hole first insulation layers 38e are formed in a bottomed cylindrical shape so as to come in contact with the inner walls of the memory columnar semiconductor layers 37b in the upper source-side holes 26b and the lower memory holes 35a.

The memory-hole second insulation layers 38f are formed in a columnar shape so as to come in contact with the inner walls of the memory-hole first insulation layers 38e in the upper source-side holes 26b and the lower memory holes 35a. In addition, a void 381f is formed in each of the memory-hole second insulation layers 38f.

Unlike the first to fourth embodiments, the drain-side selection transistor layer 40b has drain-side holes 46a formed therein so as to penetrate the drain-side second insulation layer 43, the drain-side conductive layer 42, and the drain-side first insulation layer 41 at positions matching the upper memory holes 35b.

A drain-side gate insulation layer 47, a drain-side columnar semiconductor layer 48b, a drain-side-hole first insulation layer 49f, and a drain-side-hole second insulation layer 49g are formed in each drain-side hole 46a and upper memory hole 35b.

The drain-side gate insulation layers 47 are formed in a hollow cylindrical shape so as to come in contact with the sidewalls facing the drain-side holes 46a.

The drain-side columnar semiconductor layers 48b are formed in a bottomed cylindrical shape so as to come in contact with the drain-side gate insulation layers 47 and the memory columnar semiconductor layers 37b in the upper memory holes 35b and the drain-side holes 46a.

The drain-side-hole first insulation layers 49f are formed in a bottomed cylindrical shape so as to come in contact with the inner walls of the drain-side columnar semiconductor layers 48b in the upper memory holes 35b and the drain-side holes 46a.

The drain-side-hole second insulation layers 49g are formed in a columnar shape so as to come in contact with the inner walls of the drain-side-hole first insulation layers 49f in the upper memory holes 35b and the drain-side holes 46a. A void 491g is formed in each of the drain-side-hole second insulation layers 49g. In addition, a barrier metal layer 55a and a wiring conductive layer 56a are formed on the drain-side-hole second insulation layers 49g.

(Manufacturing Process of Non-Volatile Semiconductor Storage Device in Fifth Embodiment)

Figure 50:
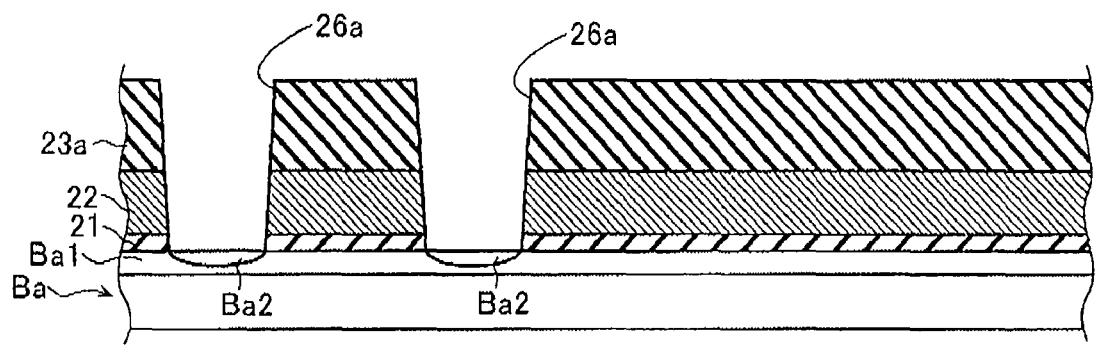
FIG. 50 is a cross-sectional view of the non-volatile semiconductor storage device in a manufacturing process according to the fifth embodiment.
Figure 51:
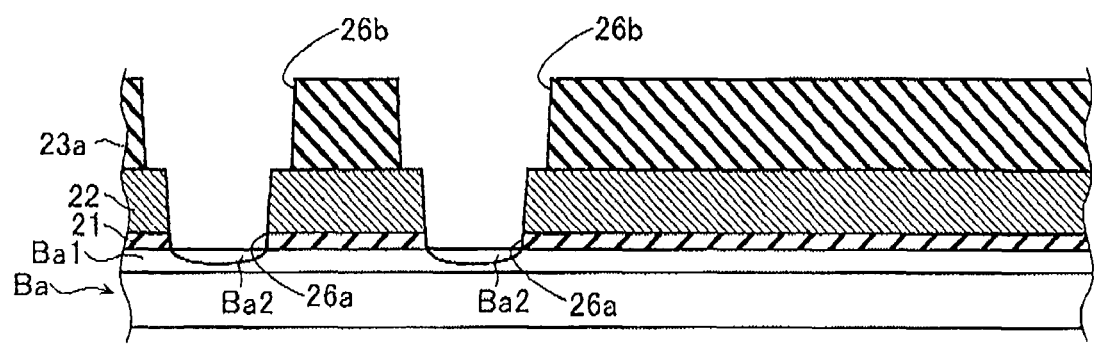
FIG. 51 is a cross-sectional view of the non-volatile semiconductor storage device in a manufacturing process according to the fifth embodiment.

Referring now to FIG. 50 and FIG. 51, a manufacturing process of the non-volatile semiconductor storage device according to the fifth embodiment will be described below.

Firstly, as illustrated in FIG. 50, lower source-side holes 26a are formed to penetrate a source-side second insulation layer 23a, a source-side conductive layer 22, and a source-side first insulation layer 21. Then, as illustrated in FIG. 51, upper source-side holes 26b are formed at positions matching the lower source-side holes 26a so as to penetrate the source-side second insulation layers 23a. In this case, the upper source-side holes 26b are formed with a larger diameter than that of the lower source-side holes 26a. Note that the step of FIG. 51 are performed by, e.g., Hot phosphoric acid treatment. After the step of FIG. 51, those described with respect to the fourth embodiment are performed.

(Advantages of Non-Volatile Semiconductor Storage Device in Fifth Embodiment)

Advantages of the non-volatile semiconductor storage device according to the fifth embodiment will now be described below. The non-volatile semiconductor storage device according to the fifth embodiment has the same advantages as the fourth embodiment.

In addition, in the non-volatile semiconductor storage device according to the fifth embodiment, the upper portions of the source-side columnar semiconductor layers 28a are formed in contact with the bottom portions of the memory columnar semiconductor layers 37b in the upper source-side holes 26b with a larger hole diameter than the lower source-side holes 26a. Thus, according to the fifth embodiment, a larger contact area may be provided between the memory columnar semiconductor layers 37b and the source-side columnar semiconductor layers 28a, as compared with the fourth embodiment.

In addition, in the non-volatile semiconductor storage device according to the fifth embodiment, the upper portions of the memory columnar semiconductor layers 37b are formed in contact with the bottom portions of the drain-side columnar semiconductor layers 48b in the upper memory holes 35b with a larger hole diameter than the lower memory holes 35a. Thus, according to the fifth embodiment, a larger contact area may be provided between the drain-side columnar semiconductor layers 48b and the memory columnar semiconductor layers 37b, as compared with the fourth embodiment.

As can be seen from the above, the non-volatile semiconductor storage device according to the fifth embodiment may further reduce the contact resistance than in the fourth embodiment. In addition, the non-volatile semiconductor storage device according to the fifth embodiment may provide further improvements in the production yields than in the fourth embodiment since a larger deviation of alignment can be accepted.

Sixth Embodiment (Specific Configuration of Non-Volatile Semiconductor Storage Device in Sixth Embodiment)

Figure 52:
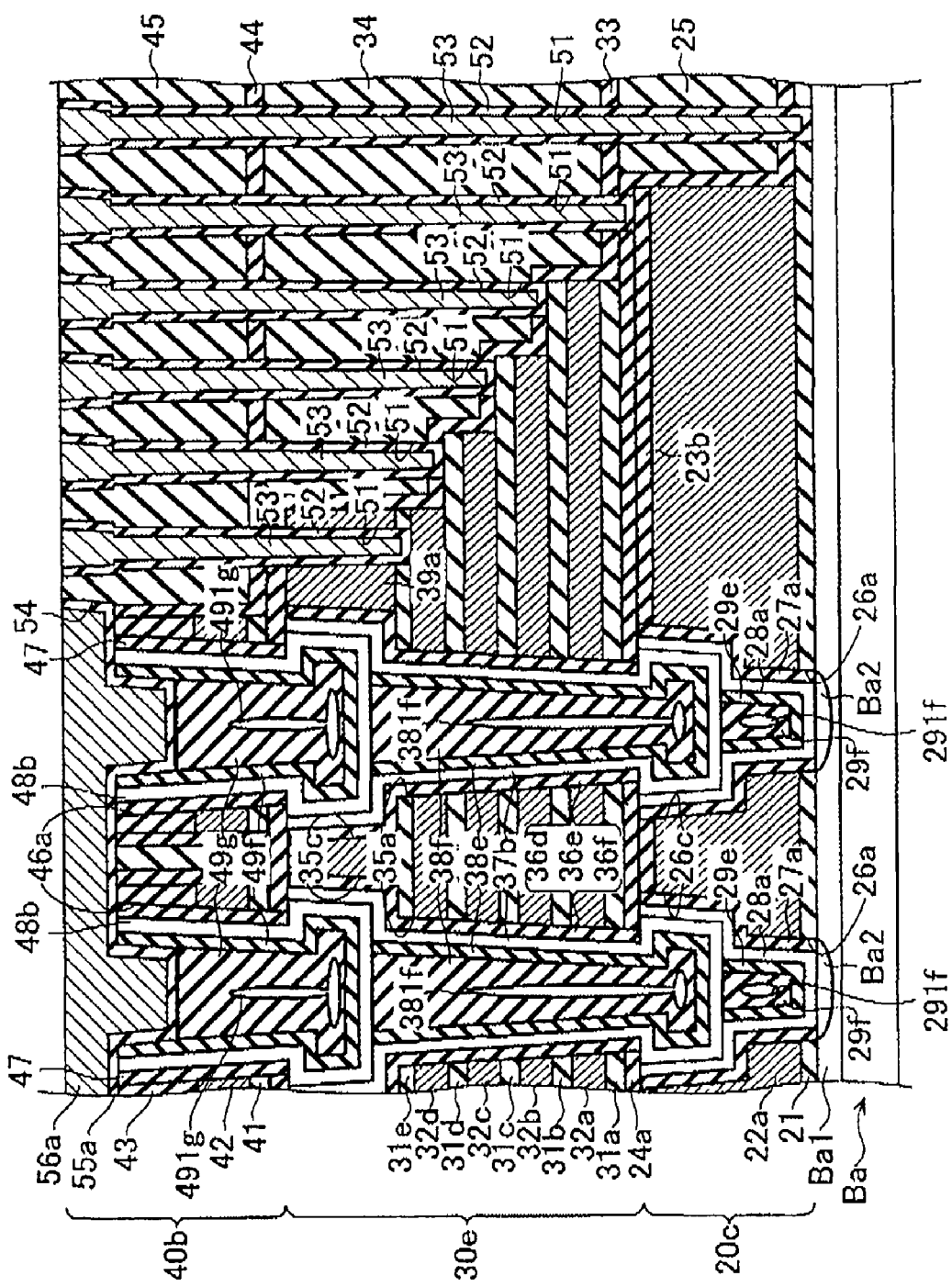
FIG. 52 is a cross-sectional view of a non-volatile semiconductor storage device according to a sixth embodiment.

Referring now to FIG. 52, a specific configuration of a non-volatile semiconductor storage device according to a sixth embodiment will be described below. As illustrated in FIG. 52, the non-volatile semiconductor storage device according to the sixth embodiment is different from the fifth embodiment in the configuration of a source-side selection transistor layer 20c and a memory transistor layer 30e.

The source-side selection transistor layer 20c has thicker source-side conductive layers 22a and thinner source-side second insulation layers 23b, as compared with the fifth embodiment. In addition, the source-side selection transistor layer 20c has upper source-side holes 26c formed therein so as to penetrate the source-side second insulation layer 23b such that the source-side conductive layers 22a are dug down to a predetermined depth.

The memory transistor layer 30e has conductive layers 39a instead of the memory protection insulation layers 39. The memory transistor layer 30e also has upper memory holes 35c formed therein so as to penetrate the conductive layer 39a.

(Advantages of Non-Volatile Semiconductor Storage Device in Sixth Embodiment)

Advantages of the non-volatile semiconductor storage device according to the sixth embodiment will now be described below. In the non-volatile semiconductor storage device according to the sixth embodiment, the source-side conductive layers 22a are provided on the periphery of the area (contact area) over which the source-side columnar semiconductor layers 28a come in contact with the memory columnar semiconductor layers 37b. In addition, the conductive layers 39a are provided on the periphery of the area (contact area) over which the memory columnar semiconductor layers 37b come in contact with the drain-side columnar semiconductor layers 48b. Accordingly, channels can be induced at the source-side columnar semiconductor layers 28a, the memory columnar semiconductor layers 37b, and the drain-side columnar semiconductor layers 48b in each contact area, thereby reducing resistance in each contact area. As can be seen from the above, the non-volatile semiconductor storage device according to the sixth embodiment may further reduce resistance in each contact area than in the fifth embodiment.

Other Embodiments

While embodiments of the non-volatile semiconductor storage device have been described, the present invention is not intended to be limited to the disclosed embodiments and various other changes, additions, replacements or the like may be made thereto without departing from the spirit of the invention.

For example, the above-mentioned embodiments may have another configuration where voids are provided instead of the source-side-hole second insulation layers 29b, the memory-hole second insulation layers 38b, and the drain-side-hole second insulation layers 49b. Also, for example, in the above embodiments, the source-side-hole second insulation layers 29b, the memory-hole second insulation layers 38b, and the drain-side-hole second insulation layers 49b may have compressional stresses other than silicon nitride (SiN).

Further, for example, while in the above embodiments the source-side columnar semiconductor layers, the memory columnar semiconductor layers, and the drain-side columnar semiconductor layers are formed in a bottomed cylindrical shape respectively, they may be formed in a bottomless hollow cylindrical shape.

What is claimed is:

1. A non-volatile semiconductor storage device comprising a plurality of memory strings with a plurality of electrically rewritable memory cells connected in series, each of the memory strings comprising:

a first columnar semiconductor layer extending in a direction perpendicular to a substrate and having a first hollow extending downward from its upper end;

a first insulation layer formed in contact with an outer wall of the first columnar semiconductor layer;

a second insulation layer formed on an inner wall of the first columnar semiconductor layer so as to leave the first hollow, the inner wall facing the first hollow; and a plurality of first conductive layers formed to sandwich the first insulation layer with the first columnar semiconductor layer and functioning as control electrodes of the memory cells; and a third insulation layer formed in contact with the second insulation layer so as to fill up the first hollow, one or more voids being formed in the third insulation layer.

2. The non-volatile semiconductor storage device according to claim 1, wherein the sidewall of the first columnar semiconductor layer is formed to protrude toward the first conductive layers at positions in the lamination direction where the first conductive layers are formed, and the voids in the third insulation layer are formed at positions in the lamination direction where the first conductive layers are formed.

3. The non-volatile semiconductor storage device according to claim 1, wherein the sidewall of the first columnar semiconductor layer is formed to protrude toward the first conductive layers at positions in the lamination direction between the first conductive layers, and the voids in the third insulation layer are formed at positions in the lamination direction between the first conductive layers.

4. The non-volatile semiconductor storage device according to claim 1, wherein the second insulation layer is composed of silicon oxide.

5. The non-volatile semiconductor storage device according to claim 1, wherein the third insulation layer is composed of silicon nitride.

6. The non-volatile semiconductor storage device according to claim 1, further comprising:
    selection transistors connected to respective one ends of the memory strings, wherein each of the selection transistors comprises:
        a second columnar semiconductor layer formed to extend downward from the first columnar semiconductor layer and having a second hollow extending downward from its upper end;
        a fourth insulation layer located below the first insulation layer and formed in contact with an outer wall of the second columnar semiconductor layer;
        a fifth insulation layer formed on an inner wall of the second columnar semiconductor layer so as to leave the second hollow, the inner wall facing the second hollow; and
        a second conductive layer formed to sandwich the fourth insulation layer with the second columnar semiconductor layer, the second conductive layer located below the first conductive layers and functioning as a control electrode of each of the selection transistors.

7. The non-volatile semiconductor storage device according to claim 6, wherein
    the outer wall of the first columnar semiconductor layer is formed in contact with the inner wall of the second columnar semiconductor layer, the inner wall facing the second hollow.

8. The non-volatile semiconductor storage device according to claim 7, wherein
    the second columnar semiconductor layer has a first inner diameter from the bottom end to a first height and a second inner diameter larger than the first inner diameter from the first height to the top end.

9. The non-volatile semiconductor storage device according to claim 7, wherein
    the first columnar semiconductor layer and the second columnar semiconductor layer are surrounded by the second conductive layer at positions in the lamination direction where the outer wall of the first columnar semiconductor layer contacts the inner wall of the second columnar semiconductor layer.

10. The non-volatile semiconductor storage device according to claim 1, further comprising:
    selection transistors connected to respective one ends of the memory strings, wherein each of the selection transistors comprises:
        a third columnar semiconductor layer formed to extend upward from the first columnar semiconductor layer and having a third hollow extending downward from its upper end;
        a sixth insulation layer located above the first insulation layer and formed in contact with an outer wall of the third columnar semiconductor layer;
        a seventh insulation layer formed on an inner wall of the third columnar semiconductor layer so as to leave the third hollow, the inner wall facing the third hollow; and
        a third conductive layer formed to surround the sixth insulation layer with the third columnar semiconductor layer, the third conductive layer located above the first conductive layers and functioning as a control electrode of each of the selection transistors.

11. A non-volatile semiconductor storage device comprising a plurality of memory strings with a plurality of electrically rewritable memory cells connected in series and selection transistors connected to respective one ends of the memory strings,
    each of the selection transistors comprising:
        a first columnar semiconductor layer extending in a direction perpendicular to a substrate and having a first hollow extending downward from its upper end;
        a first insulation layer formed in contact with an outer wall of the first columnar semiconductor layer;
        a second insulation layer formed on an inner wall of the first columnar semiconductor layer so as to leave the first hollow, the inner wall facing the first hollow;
        a first conductive layer formed to sandwich the first insulation layer with the columnar semiconductor layer and functioning as a control electrode of each of the selection transistors; and
        a third insulation layer formed in contact with the second insulation layer so as to fill up the first hollow,
    one or more voids being formed in the third insulation layer.

* * * * *